United States Patent
Spindler et al.

(10) Patent No.: US 7,638,207 B2
(45) Date of Patent: Dec. 29, 2009

(54) OLED DEVICE WITH IMPROVED EFFICIENCY AND LIFETIME

(75) Inventors: Jeffrey P. Spindler, Rochester, NY (US); Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 510 days.

(21) Appl. No.: 11/393,316

(22) Filed: Mar. 30, 2006

(65) Prior Publication Data

US 2007/0231596 A1 Oct. 4, 2007

(51) Int. Cl.
*H01L 51/54* (2006.01)

(52) U.S. Cl. .................. 428/690; 428/917; 313/504; 313/506

(58) Field of Classification Search .................. 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| 4,769,292 A | 9/1988 | Tang et al. |
| 5,853,905 A | 12/1998 | So et al. |
| 5,989,737 A | 11/1999 | Xie et al. |
| 6,387,546 B1 * | 5/2002 | Hamada et al. ............ 428/690 |
| 6,565,996 B2 | 5/2003 | Hatwar et al. |
| 6,692,846 B2 | 2/2004 | Hatwar et al. |

OTHER PUBLICATIONS

"Organic Electroluminescent Diodes" by Tang et al.; Appl. Phys. Lett. 51 (12), Sep. 21, 1987; pp. 913-915.
"Electroluminescence in Organic Films with Three-Layer Structure" by Adachi et al.; JP Journal of Applied Physics; vol. 27, No. 2; Feb. 1988, pp. L269-L271.
"Electroluminescence of Doped Organic Thin Films" by Tang et al.; J. Appl. Phys. 65(9), May 1, 1989; pp. 3610-3616.
"Improving the Efficiency and Stability of Organic Light Emitting Devices by Using Mixed Emitting Layers" by Popovic et al.; Jul. 1998; SPIE vol. 3476, pp. 68-72.

* cited by examiner

*Primary Examiner*—Dawn Garrett
(74) *Attorney, Agent, or Firm*—Raymond L. Owens

(57) ABSTRACT

An improved OLED structure that enhances both stability and luminance efficiency, includes a substrate; an anode and a cathode; a light-emitting layer disposed between the anode and cathode; and a hole-transporting structure disposed between the light-emitting layer and the anode including two or more sublayers; a first sublayer in contact with the light-emitting layer and including a first hole-transporting material and a first stabilizing dopant, and a second sublayer including a second hole-transporting material and a second stabilizing dopant, and a third dopant having a bandgap that is smaller than each of the bandgaps of the second hole-transporting material and the second stabilizing dopant, respectively.

7 Claims, 1 Drawing Sheet

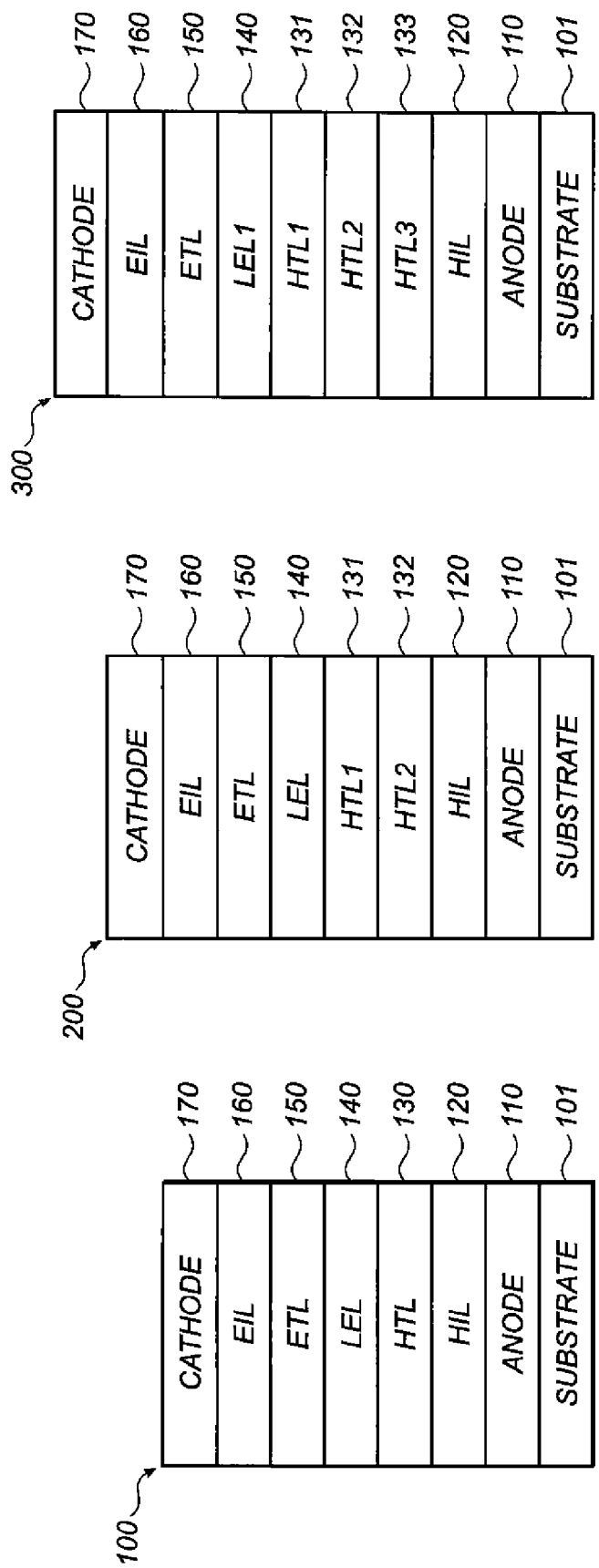

OLED DEVICE WITH IMPROVED EFFICIENCY AND LIFETIME

FIELD OF THE INVENTION

The present invention relates to providing an organic electroluminescent device having improved luminance efficiency and lifetime.

BACKGROUND OF THE INVENTION

Organic electroluminescent (EL) devices, or organic light-emitting diodes (OLEDs), are electronic devices that emit light in response to an applied potential. The structure of an OLED includes, in sequence, an anode, an organic EL unit, and a cathode. The organic EL unit disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic Electroluminescent Diodes", Applied Physics Letters, 51, 913 (1987), and commonly assigned U.S. Pat. No. 4,769,292 demonstrated highly efficient OLEDs using such a layer structure. Since then, numerous OLEDs with alternative layer structures have been disclosed. For example, there are three layer OLEDs that contain an organic light-emitting layer (LEL) between the HTL and the ETL, such as that disclosed by Adachi et al., "Electroluminescence in Organic Films with Three-Layer Structure", Japanese Journal of Applied Physics, 27, L269 (1988), and by Tang et al., "Electroluminescence of Doped Organic Thin Films", Journal of Applied Physics, 65, 3610 (1989). The LEL commonly includes a host material doped with a guest material wherein the layer structures are denoted as HTL/LEL/ETL. Further, there are other multilayer OLEDs that contain more functional layers in the devices. At the same time, many kinds of EL materials are also synthesized and used in OLEDs. These new structures and new materials have further resulted in improved device performance.

In recent years, EL devices have expanded to include not only single color emitting devices, such as red, green and blue, but also devices that emit white light. Monochrome, multi-color and full color display devices can be prepared. The precision shadow mask pattering of red, green and blue pixels have prepared full color passive matrix and active devices. In this case, each of the pixels should be efficient and should be stable to make a high operational stable full color display. White light producing OLED devices are highly desirable in the industry and are considered as a low cost alternative for several applications such as full color displays, paper-thin light sources, backlights in LCD displays, automotive dome lights, and office lighting. Using the white color emitting OLED and the use of color filters have also demonstrated the full color displays.

It is expected that for the display applications, the operational half-lifetime to be greater five years. In addition to the continued need to provide OLEDs having improved lifetime, it is desirable to have OLED devices with good operational performance in luminance and voltage stability over the lifetime of the OLED device under varying operating conditions. For practical applications, OLED devices should have high luminance stability and voltage stability under ambient conditions as well as higher operating temperature conditions An OLED is actually a current driven device. Its luminance is proportional to current density, but its lifetime is inversely proportional to current density. In order to achieve high brightness, an OLED has to be operated at a relatively high current density, but this will result in a short lifetime. Thus, it is critical to improve the luminance efficiency of an OLED while operating at the lowest possible current density comprising with the intended luminance requirement to increase the operational lifetime. Much work has been done in improving the lifetime and the luminance efficiency of the OLED devices.

The following patents and publications disclose the preparation of OLEDs with improved operational lifetime. Modifications of the multilayer structure, stabilized cathode materials, and confinement of various carriers and their recombination within the emission zone have achieved significant improvement in the operational lifetime of these devices. So et al., in U.S. Pat. No. 5,853,905, discussed an EL device comprising of a single organic emission layer containing a mixture of electron-transport and hole-transport materials, sandwiched between anode and cathode. However, this device has low efficiency. Popovic et al., in SPIE Conference Proceedings, Vol. 3476, pp. 68-72, 1998, described an EL device with improved efficiency and operational lifetime prepared by mixing an emitting electron-transport material and a hole-transport material in a light-emitting layer. Xie et al., in U.S. Pat. No. 5,989,737, disclosed an OLED in which the hole-transport layer comprises a tertiary aromatic amine doped with a polycyclic aromatic hydrocarbon such as rubrene. It is also important that all the emitters should have high stability. The red, green, yellow and white emitting devices have been shown to have high operational stability. However, the blue emitting devices do not have good stability. For full color pixilated RGB display, a true blue color with excellent operational stability is required for eliminated the differential aging of the different colors in the full color panel. Substantial improvements in blue OLED luminance yield and external efficiency directly translate into lower power-consumption devices. In full-color OLED displays, the blue current density required to produce an image is directly related to the external efficiency of the blue color. Higher blue external efficiency will dramatically reduce the pixel current density required to produce an image at a given brightness, thereby increasing lifetime. Operational stability of the blue emissive materials is typically the limiting factor for overall display lifetime; therefore improvements in blue materials stability dramatically increase the overall display performance.

In OLED devices, there is a further need for improved lifetime. Commonly assigned U.S. Pat. No. 6,692,846 B2 and U.S. Pat. No. 6,565,996 B2 both show effective ways for improving such stability. However, these patents do not disclose a way to improve luminance efficiency of the light-emitting layer.

SUMMARY OF THE INVENTION

It is an object of the present invention to provide an improved OLED structure that enhances both stability and luminance efficiency.

This object is achieved by an organic electroluminescent device, comprising:

a) a substrate;

b) an anode and a cathode;

c) a light-emitting layer disposed between the anode and cathode; and d) a hole-transporting structure disposed between the light-emitting layer and the anode including two or more sublayers, a first sublayer in contact with the light-emitting layer and including a first hole-transporting material and a first stabilizing dopant, and a second sublayer including a second hole-transporting material and a second stabilizing dopant, and a third dopant having a bandgap that is smaller than each of the bandgaps of the second hole-transporting material and the second stabilizing dopant, respectively It is another object of the present invention to make a stable blue, green and red emitting OLED device high efficiency, a low initial drive voltage, low voltage rise during the operation, and long lifetime.

It has been found that significant improvements in stability and luminance efficiency can be achieved by using the hole-transporting structure having at least two sub layers, which are appropriately doped.

It is an advantage of the present invention that the OLED devices have low change in the drive voltage during operation.

Also these devices show smaller change in the luminance efficiency as a function of current density.

These devices also show smaller change in the color chromaticity as a function of current density.

BRIEF DESCRIPTION OF THE DRAWINGS

FIG. 1 depicts a schematic cross sectional view of an OLED, structure

FIG. 2 depicts a schematic cross sectional view an OLED structure according to the present invention.

FIG. 3 depicts a schematic cross sectional view of white emitting OLED structure according to the present invention.

It will be understood that FIGS. 1-3 are not to scale since the individual layers are too thin and the thickness differences of various layers too great to permit depiction to scale.

DETAILED DESCRIPTION OF THE INVENTION

Several terms to be used in the following description are explained herein. The term "full color" is employed to describe the emission color in the red, green, and blue regions of the visible spectrum. The red, green, and blue colors constitute the three primary colors from which other colors can be produced by appropriate mixing. Broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. Although the white light can have a strong hue and still be useful, preferably, white color has Commission International de l'Eclairage (CIE) coordinates of about CIE x=0.31±0.05 and CIE y=0.33±0.05. This is the color of a $D_{65}$ white, which is particularly advantages for RGBW displays having red, green, blue, and white pixels as described in WO 2004/061963. The term "pixel" is employed in its art-recognized usage to designate an area of a display panel that can be stimulated to emit light independently.

Turning to FIG. 1, a typical organic light-emitting device 100 has a substrate 101 on which is disposed an anode 110. An organic light-emitting structure is formed between the anode 110 and a cathode 170. The organic light-emitting structure is comprised of, in sequence, a hole-injection layer 120, an organic hole-transporting layer 130, an organic light-emitting layer 140, an organic electron-transporting layer 150 and an electron injection layer 160. When an electrical potential difference (not shown) is applied between the anode 110 and the cathode 170, the cathode will inject electrons into the electron-transporting layer 150, and the electrons will migrate across layer 150 to the light-emitting layer 140. At the same time, holes will be injected from the anode 110 into the hole-transporting layer 130. The holes will migrate across layer 130 and recombine with electrons at or near a junction formed between the hole-transporting layer 130 and the light-emitting layer 140. When a migrating electron drops from its conduction band to a valance band in filling a hole, energy is released as light, which is emitted through the light-transmissive anode 110 and substrate.

Turning now to FIG. 2, there is shown a cross-sectional view of a pixel of a light-emitting OLED device 200 that can be used according to a first embodiment of the present invention. The structure is similar to OLED device 100 except that it includes two hole transporting sublayers, the first hole transporting layer HTL1 (131) and second hole transporting layer, HTL2 (132.). The first hole transporting sublayer (131), according to one of the embodiments of this invention, comprises a hole transporting material and stabilizing dopant. The second hole transporting sublayer (HTL2) comprises a hole transporting material, a second stabilizing dopant and a third stabilizing dopant. According to one of the embodiments of this invention, the first and second hole-transporting materials are the same and the first and second stabilizing dopants are the same. The thickness of the each of the sublayers; HTL1 and sublayer HTL2 is between 5 nm and 50 nm.

Turning now to FIG. 3, there is shown a cross-sectional view of a pixel of a light-emitting OLED device 300 that can be used according to a second embodiment of the present invention. The structure is similar to OLED device 100 except that it includes three hole-transporting sublayers: first hole transporting sublayer HTL1 (131), second hole transporting sublayer, HTL2 (132.) and third hole transporting sublayer (HTL3, 133). In this case, the first hole transporting sublayer (131), comprises a hole transporting material and stabilizing dopant. The second hole transporting sublayer (HTL2) comprises of a hole transporting material, a second stabilizing dopant and a third stabilizing dopant. The third hole transporting sublayer (HTL3, 133) comprises mainly a hole transporting material. In some cases, the first and second hole-transporting materials are the same and the first and second stabilizing dopants are the same. The thickness of hole transporting sublayers HTL1 and HTL2 is between 5-50 nm. The components of the above OLED structures will be described in more detail in the following paragraphs.

Substrate 101 can be an organic solid, an inorganic solid, or include organic and inorganic solids. Substrate 101 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 101 can be a homogeneous mixture of materials, a composite of materials, or multiple layers of materials. Substrate 101 can be an OLED substrate, that is a substrate commonly used for preparing OLED devices, e.g. active matrix low temperature polycrystalline silicon or amorphous-silicon TFT substrate. The substrate 101 can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, metal, semiconductor materials, ceramics, and circuit board materials, or any others commonly used in the formation of OLED devices, which can be either passive matrix devices or active matrix devices.

An electrode is formed over substrate 101 and is most commonly configured as an anode 110. However, the OLED devices of this invention are not limited to this configuration, and can instead have a cathode as the first electrode. For the purposes of this discussion, the electrode adjacent to the substrate is considered the anode. When EL emission is viewed through the substrate 101, anode 110 should be transparent or substantially transparent to the emission of interest. Common transparent anode materials useful in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, such as transparent, opaque or reflective. Example conductors for this application include, but are not limited to, gold, iridium, molybdenum, palladium, and platinum. The preferred anode materials, transmissive or otherwise, have a work function of no less than 4.0 eV. Desired anode materials are commonly deposited by any suitable way such as evaporation, sputtering, chemical vapor deposition, or electrochemical process. Anodes can be patterned using traditional photolithographic processes. Optionally, anodes can be polished prior to the deposition of other layers to reduce surface roughness so as to reduce electrical shorts or enhance reflectivity.

While not always necessary, it is often useful that a hole-injecting layer 120 be formed over anode 110 in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, some aromatic amines, for example, m-MTDATA (4,4',4"-tris[(3-methylphenyl)phenylamino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

Hexaazatriphenylene derivatives, as described in U.S. Pat. No. 6,720,573, and some other hole-injection materials described in U.S. patent application Ser. No. 11/064,386 filed Feb. 11, 2005 by Liang-Sheng Liao et al., entitled "Tandem OLEDs having Organic Intermediate Connector", are also a useful class of hole-injecting materials. These organic materials have been found to have a dual purpose as organic connector and hole-injection layer or electron accepting layer. The organic materials for the hole-injection layer can include a chemical compound of the following formula:

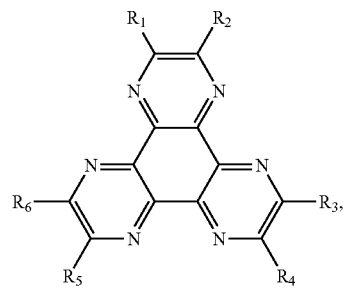

wherein $R_1$-$R_6$ represents hydrogen or a substituent independently selected from the group including halo, nitrile (—CN), nitro (—NO$_2$), sulfonyl (—SO$_2$R), sulfoxide (—SOR), trifluoromethyl (—CF$_3$), ester (—CO—OR), amide (—CO—NHR or —CO—NRR'), substituted or unsubstituted aryl, substituted or unsubstituted heteroaryl, and substituted or unsubstituted alkyl, where R and R' include substituted or unsubstituted alkyl or aryl; or wherein $R_1$ and $R_2$, $R_3$ and $R_4$, or $R_5$ and $R_6$ combine to form a ring structure including an aromatic ring, a heteroaromatic ring, or a nonaromatic ring, and each ring is substituted or unsubstituted. The specific organic materials used as hole-injection layer include Formula Q1

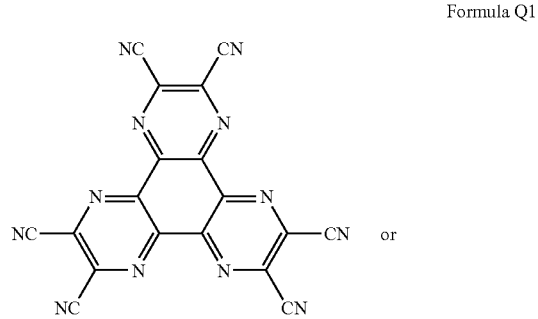

or

Formula Q2

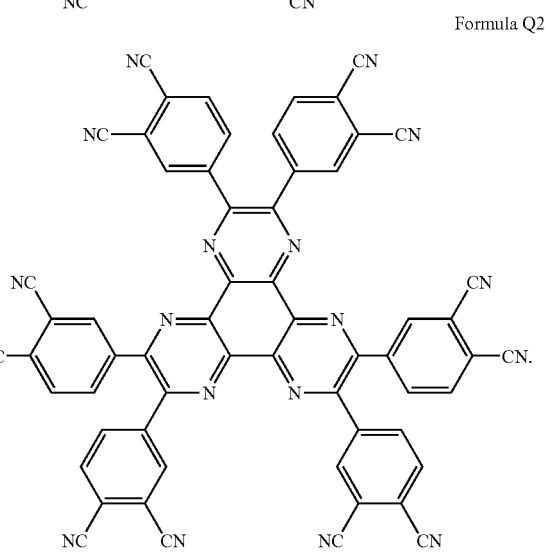

Hexaazatriphenylene derivatives may also be useful as hole-transporting (HTL) materials. In this case, these materials serve a dual purpose as hole-injecting and hole-transporting materials.

It is often useful that a hole-transporting layer 130 be formed and disposed over anode 110. Desired hole-transporting materials can be deposited by any suitable way such as evaporation, sputtering, chemical vapor deposition, electrochemical process, thermal transfer, or laser thermal transfer from a donor material. Typical hole-transporting materials useful in a hole-transporting layer are well known to include compounds such as an aromatic tertiary amine, where the latter is understood to be a compound containing at least one trivalent nitrogen atom that is bonded only to carbon atoms, at least one of which is a member of an aromatic ring. In one form, the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or comprising at least one active hydrogen-containing group are disclosed by Brantley et al. in U.S. Pat. Nos. 3,567,450 and 3,658,520.

A more preferred class of aromatic tertiary amines is that which includes at least two aromatic tertiary amine moieties as described in U.S. Pat. Nos. 4,720,432 and 5,061,569. Such compounds include those represented by structural Formula A

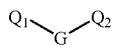

A wherein:

$Q_1$ and $Q_2$ are independently selected aromatic tertiary amine moieties; and G is a linking group such as an arylene, cycloalkylene, or alkylene group of a carbon-to-carbon bond.

In one embodiment, at least one of $Q_1$ or $Q_2$ contains a polycyclic fused ring structure, e.g., a naphthalene moiety. When G is an aryl group, it is conveniently a phenylene, biphenylene, or naphthalene moiety.

A useful class of triarylamines satisfying structural Formula A and containing two triarylamine moieties is represented by structural Formula B

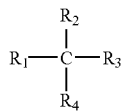

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C

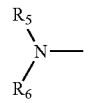

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D

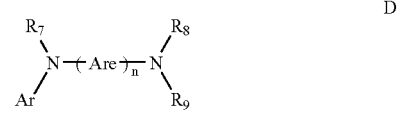

D wherein:

each Are is an independently selected arylene group, such as a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g., naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halides such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compound(s). Specifically, one can employ a triarylamine, such as a triarylamine satisfying the Formula B, in combination with a tetraaryldiamine, such as indicated by Formula D. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1":4",1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;

4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4'''-diamino-p-terphenyl;
4,4'-Bis {N-phenyl-N-[4-(1-naphthyl)-phenyl]amino}biphenyl;
2,6-Bis[N,N-di(2-naphthyl)amino]fluorene;
4,4',4''-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

US Patent Application US2005/0106419 A1 discusses spiro materials as hole-transporting layers. The structure formulae of these materials are given below. Spiro-TAD (2,2',7,7'-tetrakis(diphenylamino)spiro-9,9'-bifluorene) and spiro-NPB are examples of useful hole transport materials:

Spiro-TAD

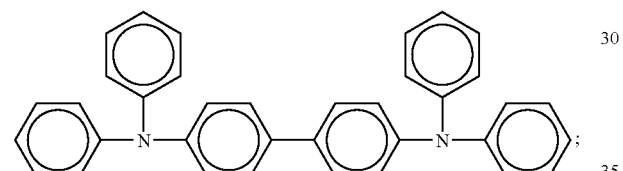

Spiro-NPB

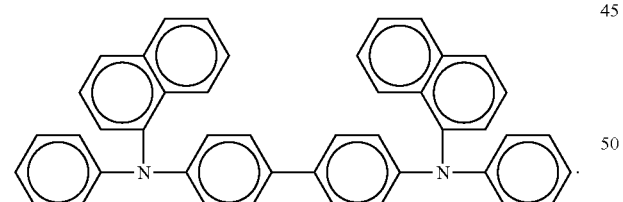

Some other hole-transporting materials useful are described in U.S. patent application Ser. No. 11/172,024 filed Jun. 30, 2005 by Wojciech Slusarek et al., entitled "Electroluminescent Devices Containing Benzidine Derivatives".

There are other materials whose structures are shown below that can be used as hole transporting materials:

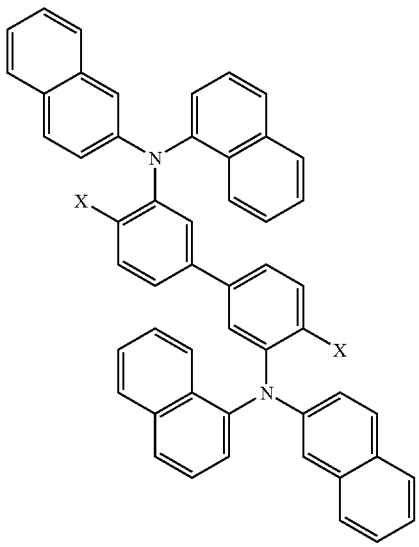

wherein X=H or X=OCH$_3$;

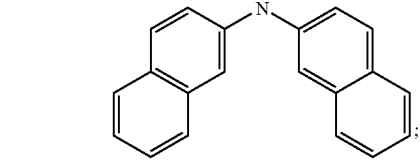

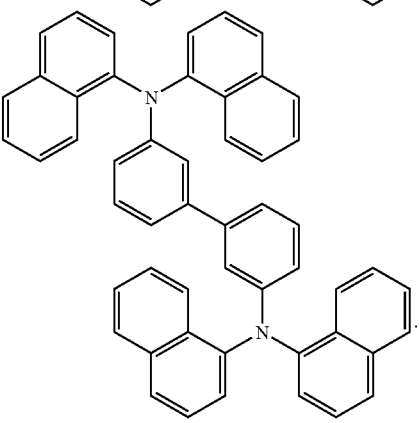

The light-emitting layer 140 is provided over the first hole-transporting sublayer 131 and includes a first host material and a first stabilizing material. The first host material is preferably a hole-transporting material. The first host material in the first hole transporting sublayer (HTL1) may be a single component or a mixture of one or more components, with the hole-transporting material being the main component, or the highest in terms of % volume. The first stabilizing material in the first hole transporting sublayer (HTL1) may be a mixture of one or more mono-anthracene derivatives provided in a volume fraction range of 5% to 50% relative to the total host volume, and one or more hole-transporting aromatic amine derivatives as the main component provided in a volume fraction range of 50% to 95% relative to the total host volume.

The mono-anthracene derivative(s) in the first light-emitting layer can be derivatives of a single anthracene nucleus having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red

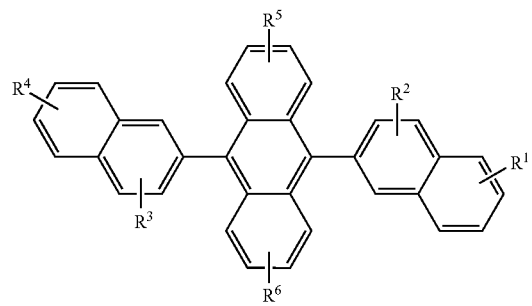

F wherein $R^1$, $R^2$, $R^3$, $R^4$, $R^5$, and $R^6$ represent one or more substituents on each ring where each substituent is individually selected from the following groups:

Group 1: hydrogen, or alkyl have from 1 to 24 carbon atoms;

Group 2: aryl or substituted aryl have from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl have from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino have from 1 to 24 carbon atoms; and Group 6: fluorine, chlorine, bromine or cyano.

The mono-anthracene derivative of Formula (I) is also a useful host material capable of supporting electroluminescence, and is particularly suitable for light emission of wavelengths longer than 400 nm, e.g., blue, green, yellow, orange or red. Mono-anthracene derivatives of Formula (I) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference

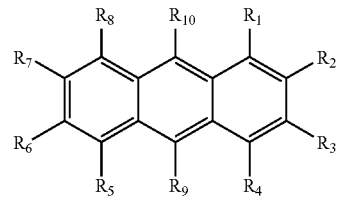

(I)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Some examples of useful mono-anthracene materials for use in a light-emitting layer include:

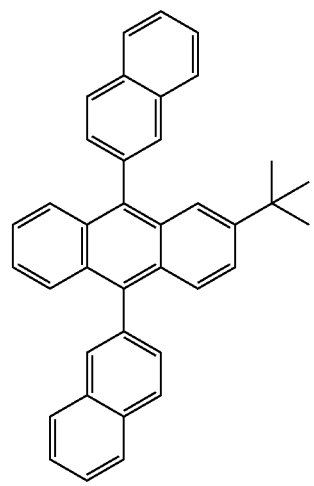

AH1

-continued
AH2
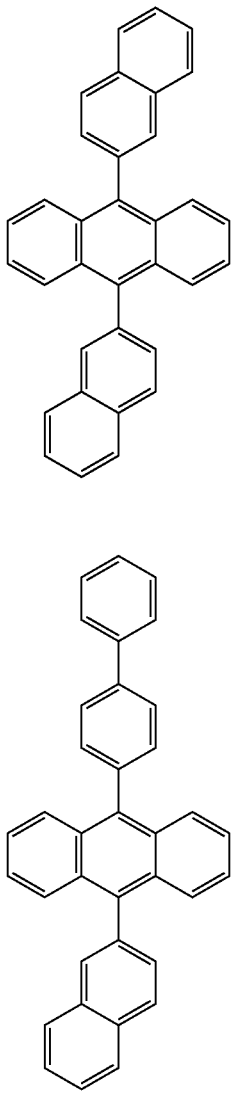
AH3
AH4
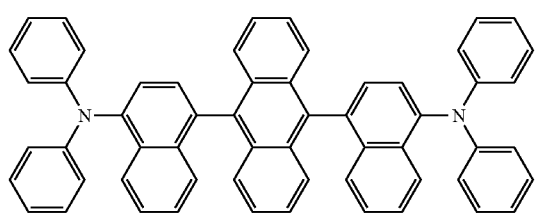
AH5
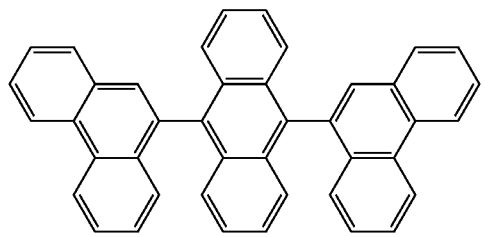
-continued
AH6
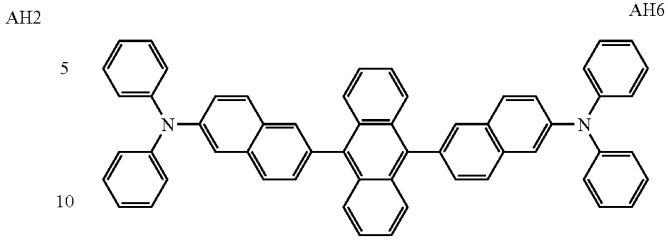
AH7
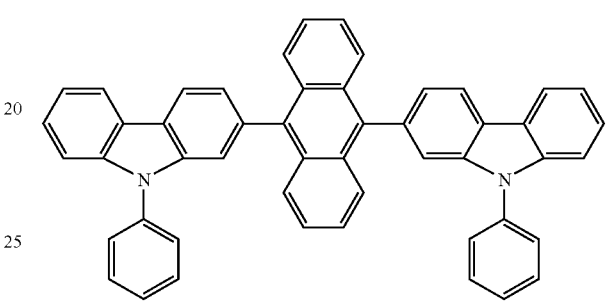
AH8
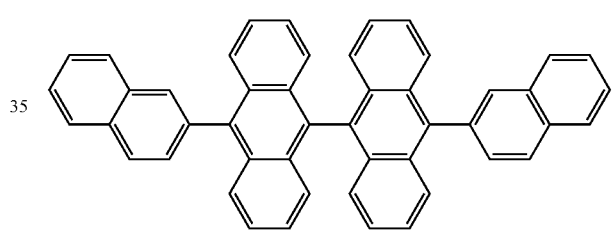
AH9
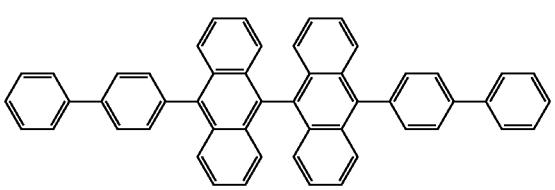
AH10
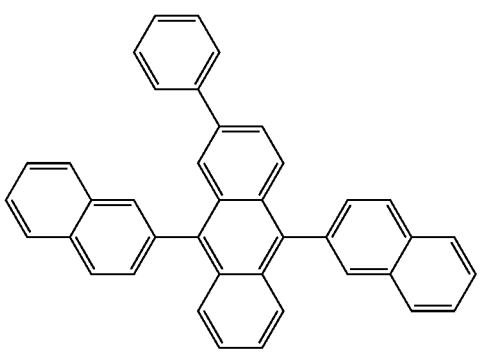

The second hole transporting sublayer 132 is provided over the third hole-transporting sublayer 133. The third hole transporting sublayer (HTL3) mainly comprises of the hole transporting material. The second hole transporting sublayer 132 includes a second-host material, a second stabilizing material and a third stabilizing materials. The host material for the second hole transporting sub layer (HTL3) is preferably a hole-transporting material. This host material may be a single component or a mixture of one or more components, with the hole-transporting material being the main component, or the highest in terms of % volume. The host material for the second hole transporting sublayer and third hole transporting sublayer can be formed of a single or a mixture of aromatic tertiary amine compound(s). Specifically, one can employ a triarylamine, such as a triarylamine. One of the useful aromatic tertiary amines is 4,4'-Bis[N-(1-naphthyl)-N-phenylamino]biphenyl (NPB);

The host material for the second hole-transporting layer is a non-electroluminescent component has a larger bandgap than the second stabilizing material and a third stabilizing materials. The non-electroluminescent components function as an initial "energy capture agent" that transfers that energy to the electroluminescent component or guest material as the primary light emitter. The second stabilizing material is also non-electroluminescent component having bandgap smaller than the host material. The non-electroluminescent components with a first bandgap and the second bandgap present in the second hole transporting layer are in an amount of at least 30 wt % and not greater than 99 wt %. Typically, the content is at least 40 wt % with a range of 40-75 wt % being desirably employed.

The second stabilizing material in the second hole transporting sublayer (HTL2) may be a mixture of one or more mono-anthracene derivatives provided in a volume fraction range of 5% to 50% relative to the total host volume, and one or more hole-transporting aromatic amine derivatives as the main component provided in a volume fraction range of 50% to 95% relative to the total host volume.

The third stabilizing material in the second hole transporting sublayer is a fluorescent dopant such as rubrene or rubrene derivatives or a suitable light-emitting red dopant such as a diindenoperylene compound. A suitable light-emitting red dopant can include a diindenoperylene compound of the following structure Q1 or the pyrin derivative.

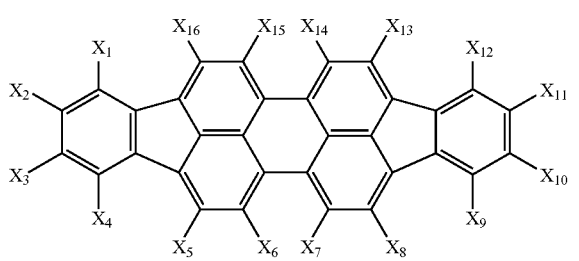

(Q1)

wherein $X_1$-$X_{16}$ are independently selected as hydro or substituents that provide red luminescence.

Another suitable red stabilizing dopant can be an electroluminescent component and is a pyran derivative represented by formula (Q2):

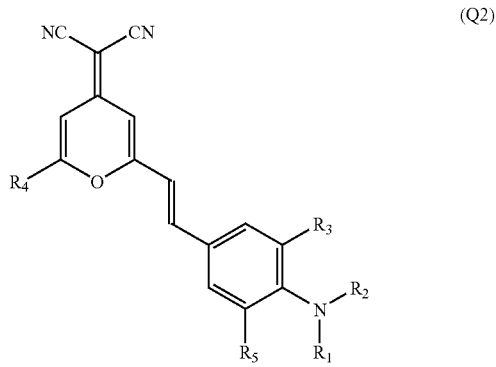

(Q2)

wherein:

$R_1, R_2, R_3, R_4$, and $R_5$ are independently selected as hydrogen or substituents;

An important relationship exists when selecting the components of the hole transporting sublayer 1 and hole transporting sublayer 2. The band gap of the non-electroluminescent component is typically higher than that of electroluminescent component material.

The bandgaps are typically determined experimentally by UVS or XPS spectroscopic techniques to characterize the energy levels and chemical nature of the HTL, LEL and ETL layers. All bandgaps as pertaining to this application are determined by the following procedure: the absorption and emission spectra for a material are measured in a nonpolar solvent such as ethylacetate or toluene at low (i.e., $<1 \times 10^{-3}$ M) concentration and optical density (i.e., <0.2) bandgaps; the spectra are normalized to one via the maximum absorption and emission bands in the visible region (i.e., 350-750 nm) of the spectrum. The normalized absorption and emission spectra are plotted on the same chart. The wavelength between the normalized absorption and emission spectra where they cross (crossing-wavelength) is defined as $E_{0,0}$ and this "optical" bandgap otherwise known in the art as the energy difference between the highest occupied molecular orbital (HOMO) level or the maximum level of the valence band and the lowest unoccupied molecular orbital (LUMO) level or the minimum level of the conducting band. This value is typically reported in eV and that conversion is made by dividing the "crossing-wavelength" into 1240 eV nm.

Following table gives the band gap for some of the materials used for first hole transporting material and first stabilizing dopant, second hole transporting material, second stabilizing dopant and third stabilizing dopant.

| Optical Bandgaps for Representative Materials | |
|---|---|
| Materials used in the invention | Bandgap (eV) |
| Third stabilizing dopant diindenoperylene compound | Bandgap = 2.12 eV |
| Third stabilizing dopant pyran derivative | 2.22 eV |
| Third stabilizing dopant rubrene | 2.31 eV |
| Third stabilizing dopant rubrene derivative | 2.27 eV |

-continued
Optical Bandgaps for Representative Materials
| Materials used in the invention | Bandgap (eV) |
|---|---|
| Third stabilizing dopant Rubrene derivative 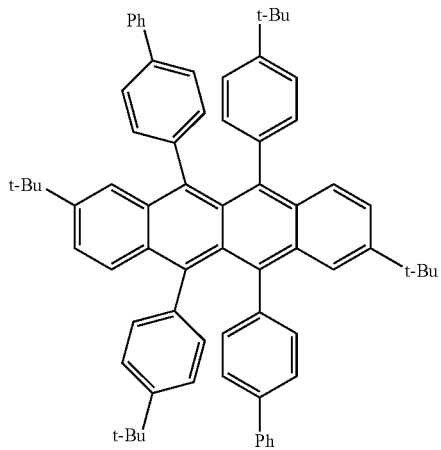 | 2.28 eV |
| First and Second stabilizing dopant anthracene derivatives 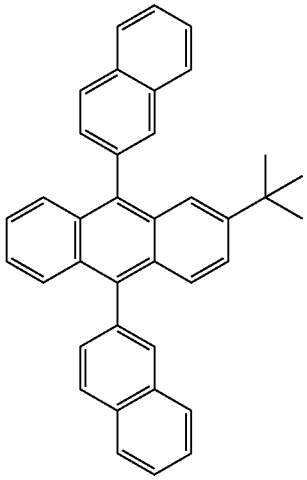 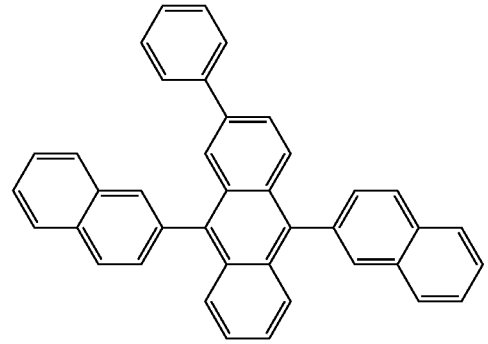 | 3.04 eV |

-continued

Optical Bandgaps for Representative Materials

| Materials used in the invention | Bandgap (eV) |
| --- | --- |
| First and Second stabilizing dopant anthracene derivative | 2.51 eV |

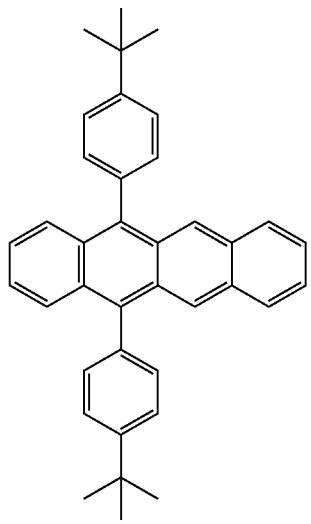

| | |
| --- | --- |
| Hole transporting material (NPB) | 3.15 eV |

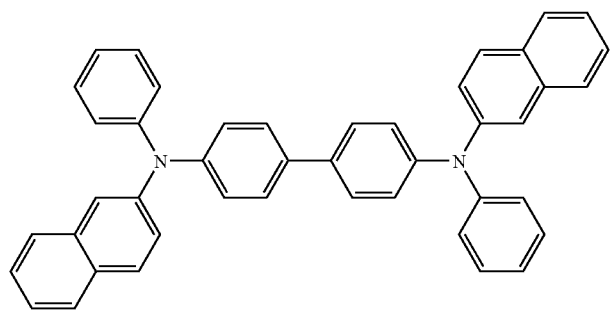

Some of the other desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrylium and thiapyrylium compounds, derivatives of distryrylbenzene or distyrylbiphenyl, bis(azinyl)methane boron complex compounds, and carbostyryl compounds. Illustrative examples of useful dopants include, but are not limited to, the following:

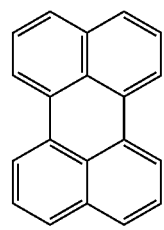

L1

-continued

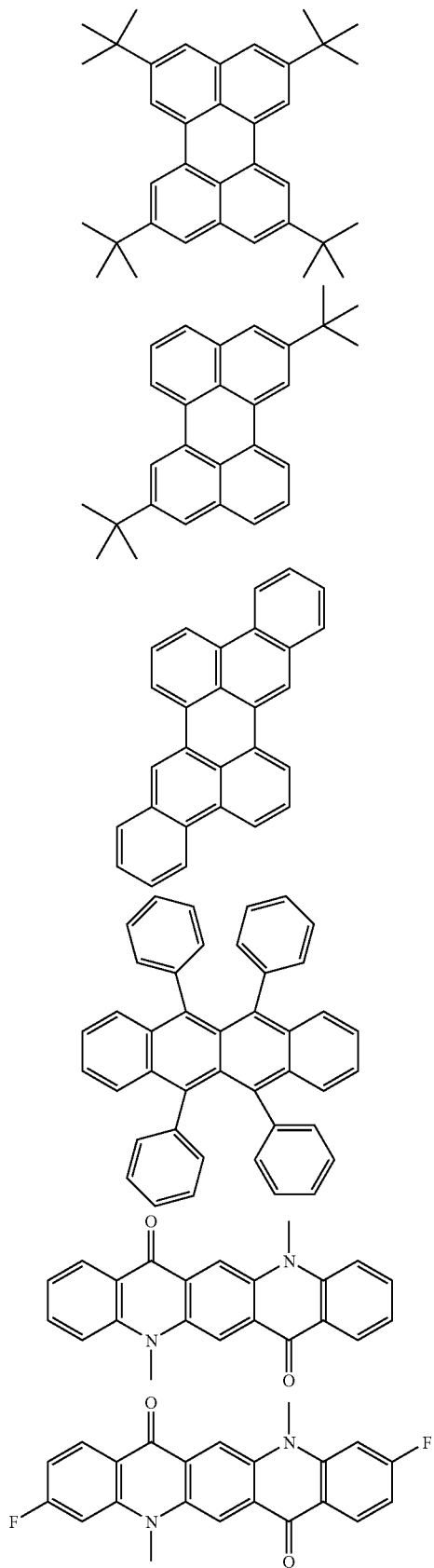

L2

L3

L4

L5

L6

L7

-continued

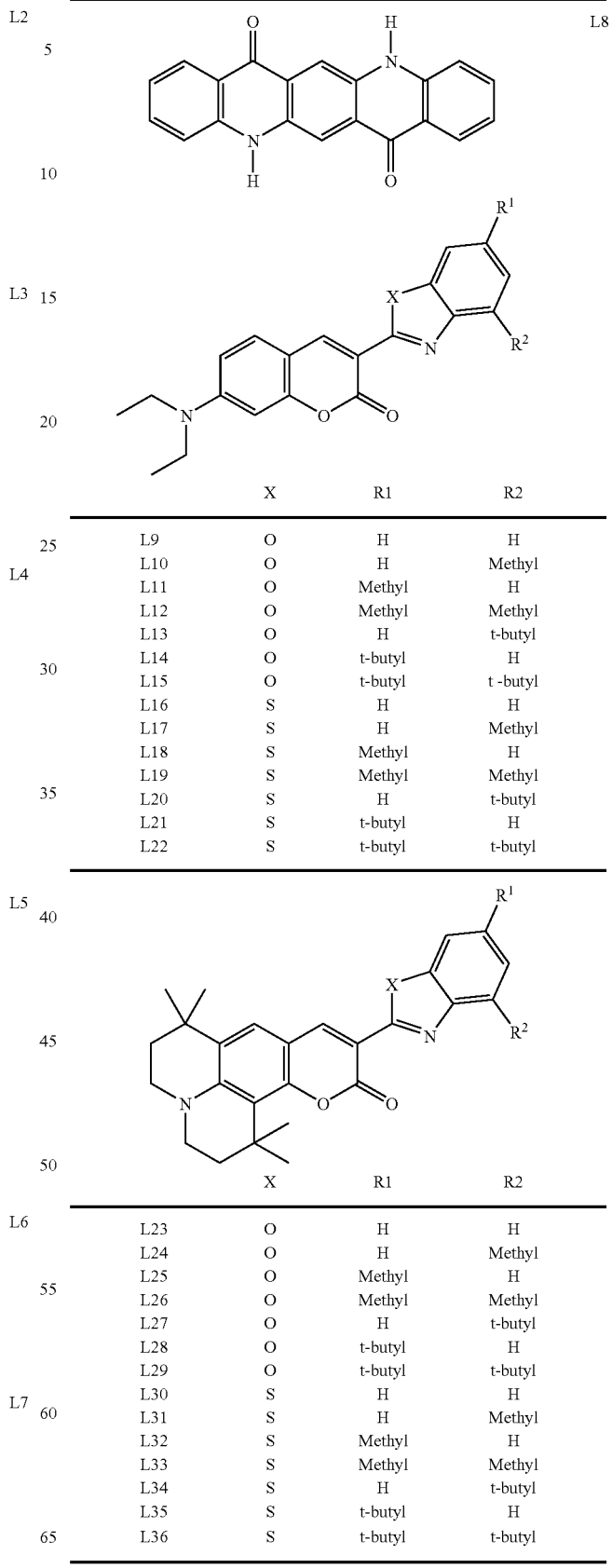

L8

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued
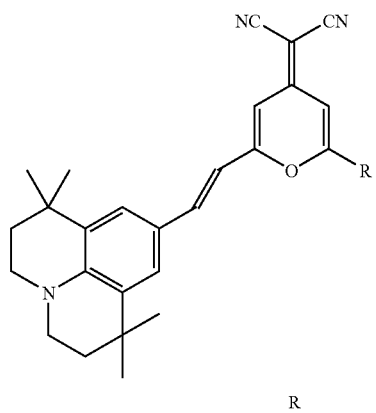
| | R |
|---|---|
| L37 | Phenyl |
| L38 | Methyl |
| L39 | t-butyl |
| L40 | Mesityl |
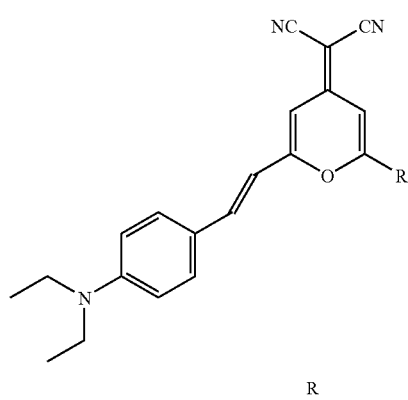
| | R |
|---|---|
| L41 | phenyl |
| L42 | methyl |
| L43 | t-butyl |
| L44 | mesityl |
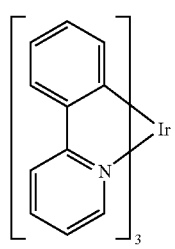
L45
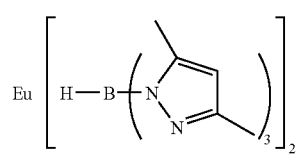
L46
-continued
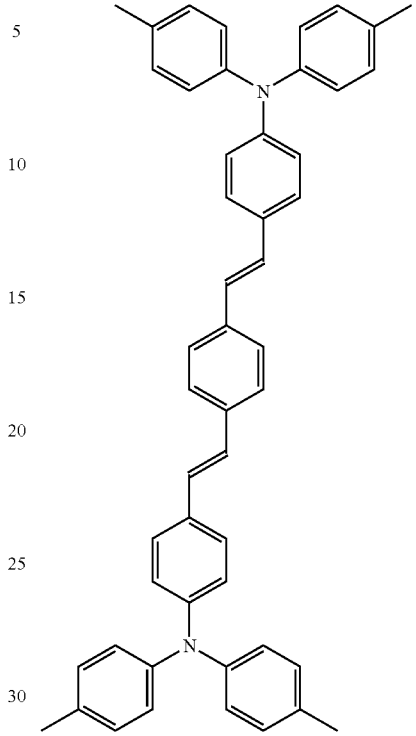
L47
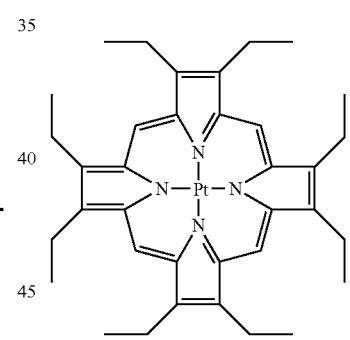
L48
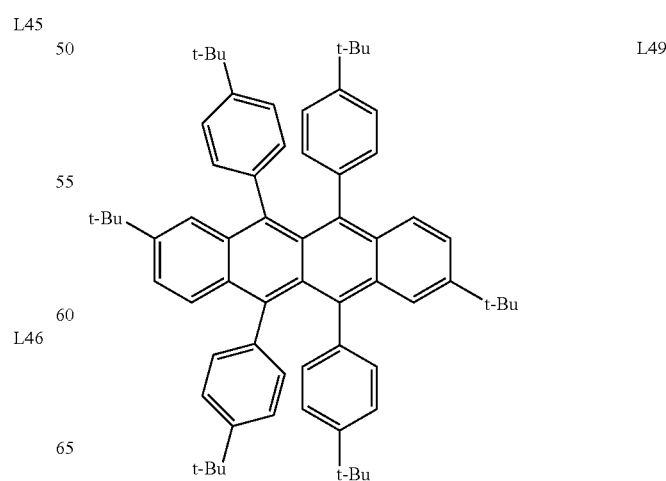
L49

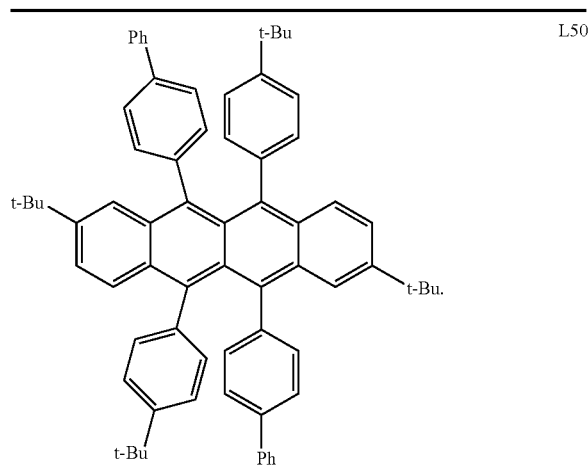

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein. First light-emitting layer 141 includes a first light-emitting material. In a preferred embodiment, first light-emitting layer can have a peak emission in the yellow to red portion of the visible spectrum, and therefore the first light-emitting material can be a light-emitting yellow, orange, or red dopant. A light-emitting yellow or orange dopant can include a compound of the following structures:

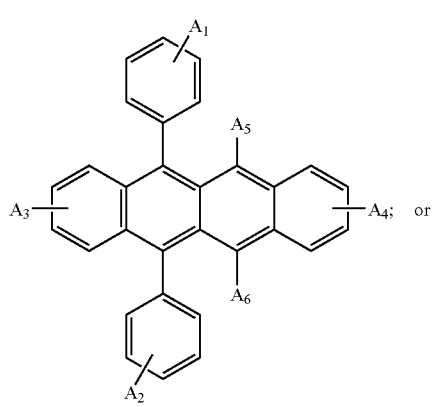

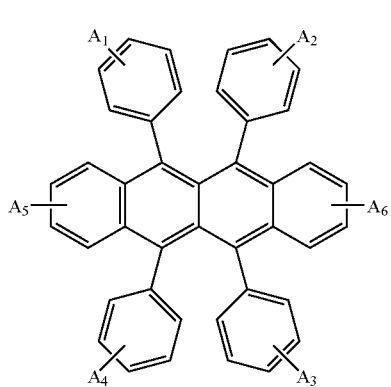

wherein $A_1$-$A_6$ represents one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow or orange dopants include 5,6,11,12-tetraphenylnaphthacene (rubrene); 6,11-diphenyl-5,12-bis(4-(6-methyl-benzothiazol-2-yl)phenyl) naphthacene (DBzR) and 5,6,11,12-tetra(2-naphthyl)naphthacene (NR), the formulas of which are shown below:

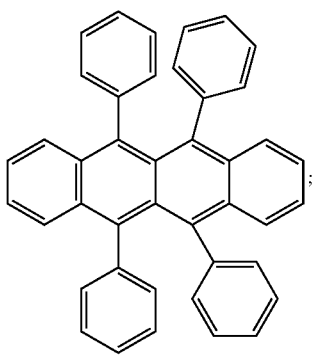

(Rubrene, P3)

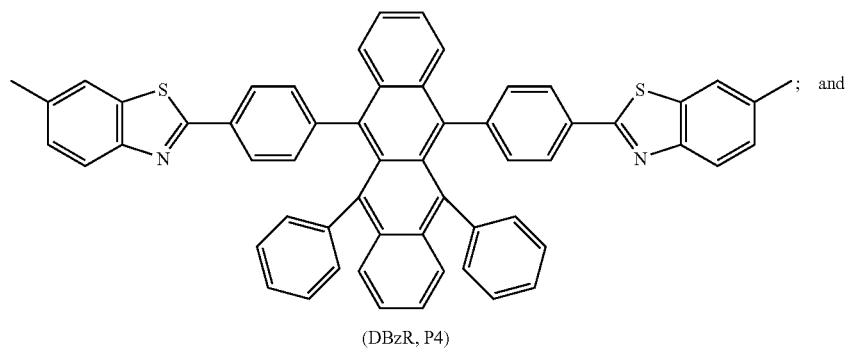

(DBzR, P4)

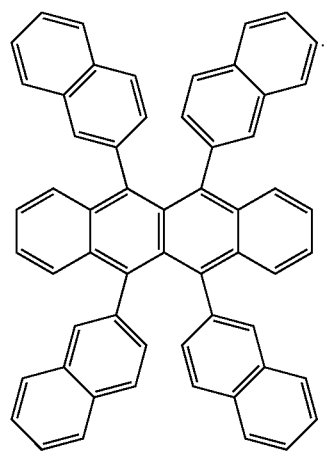

(NR, P5)

A suitable yellow or orange dopant can also be a mixture of compounds that would also be yellow or orange dopants individually.

A suitable light-emitting red dopant can include a diindenoperylene compound of the following structure Q1:

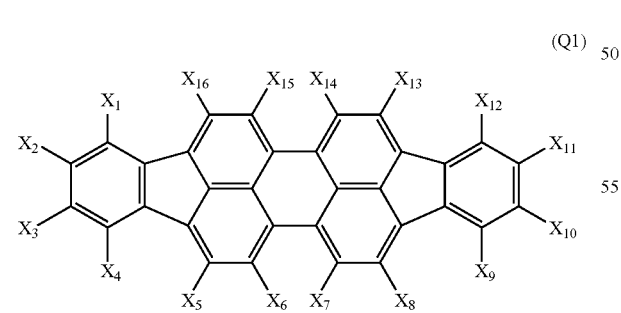

(Q1)

wherein $X_1$-$X_{16}$ are independently selected as hydro or substituents that provide red luminescence.

Illustrative examples of useful red dopants of this class include the following:

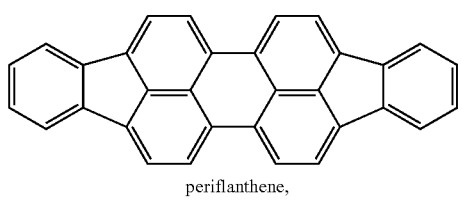

periflanthene,

Q2

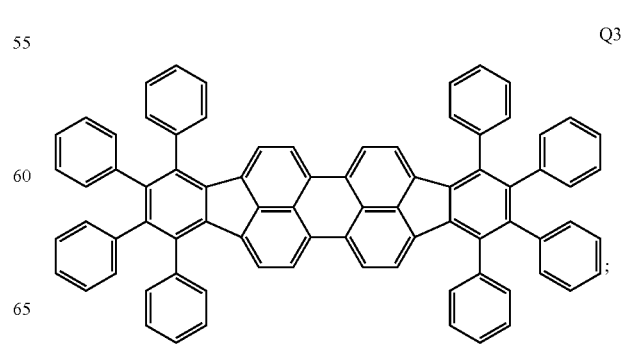

Q3

-continued
Q4
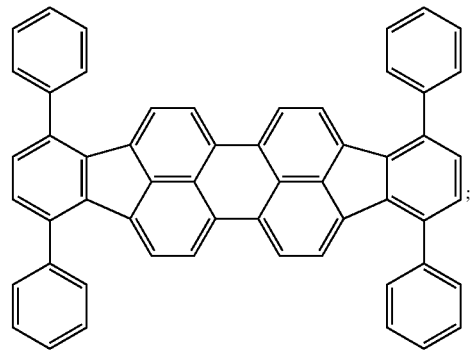
Q5
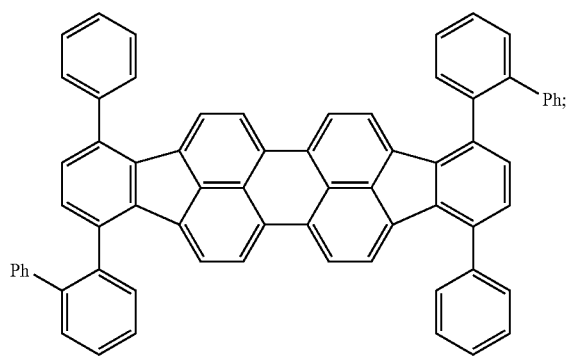
Q6
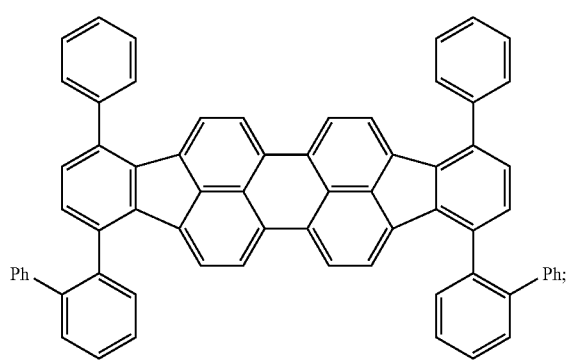
Q7
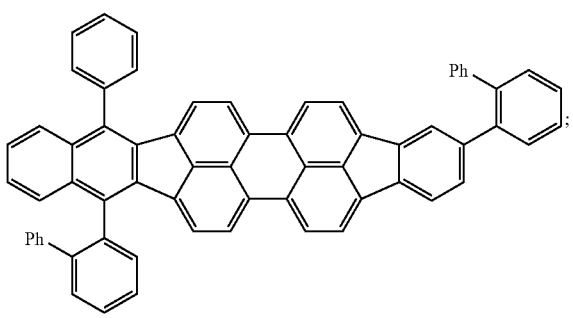
-continued
Q8
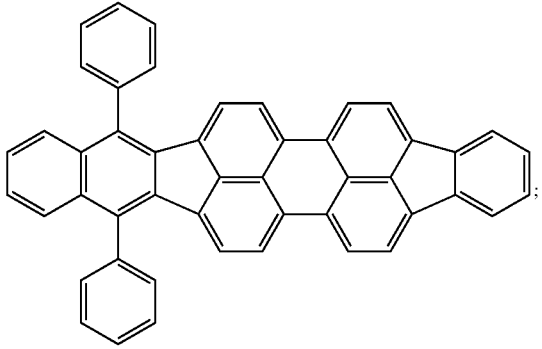
Q9
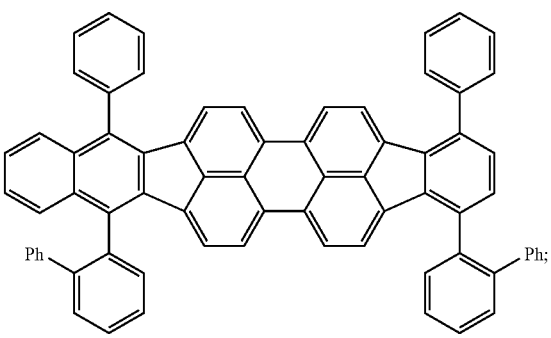
Q10
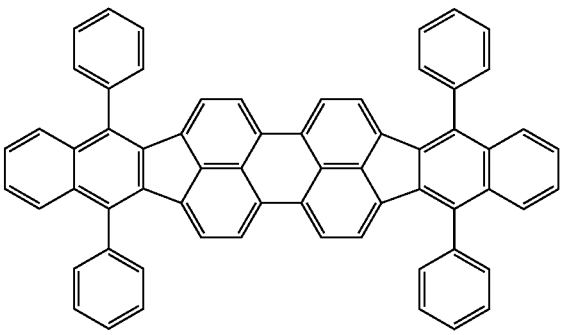
TPDBP,
A particularly preferred diindenoperylene dopant is dibenzo {[f,f']-4,4'7,7'-tetraphenyl]diindeno-[1,2,3-cd:1',2',3'-lm]perylene (TPDBP, Q10 above).
Other red dopants useful in the present invention belong to the DCM class of dyes represented by Formula S1:
(Formula S1)
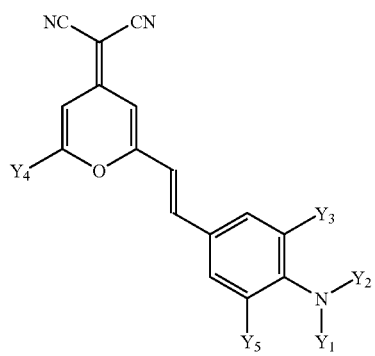

wherein:

Y$_1$-Y$_5$ represent one or more groups independently selected from hydro, alkyl, substituted alkyl, aryl, or substituted aryl; and Y$_1$-Y$_5$ independently include acyclic groups or are joined pairwise to form one or more fused rings, provided that Y$_3$ and Y$_5$ do not together form a fused ring.

In a useful and convenient embodiment that provides red luminescence, Y$_1$-Y$_5$ are selected independently from hydro, alkyl and aryl. Structures of particularly useful dopants of the DCM class are shown below:

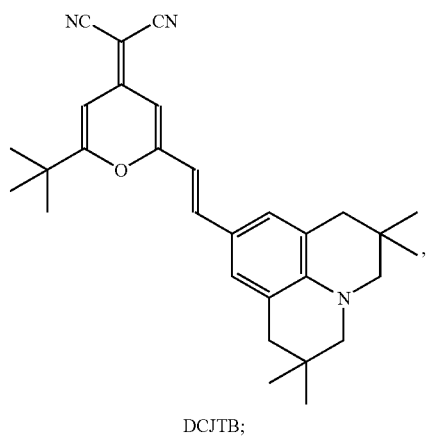

DCJTB;

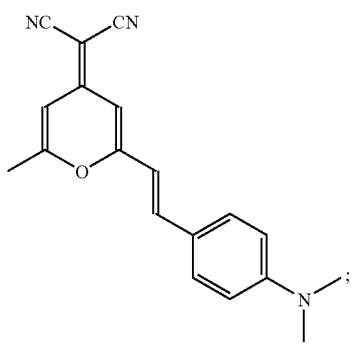

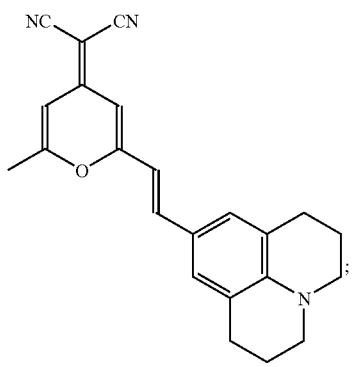

-continued

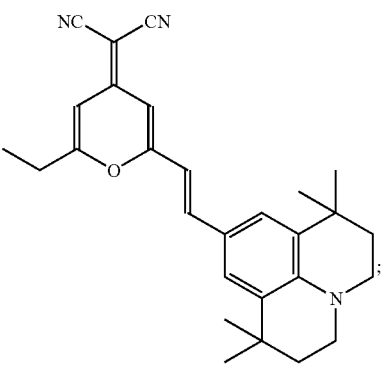

S5

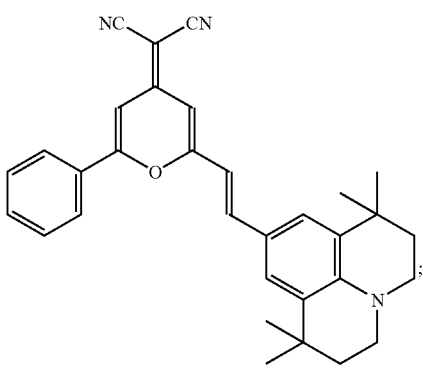

L37

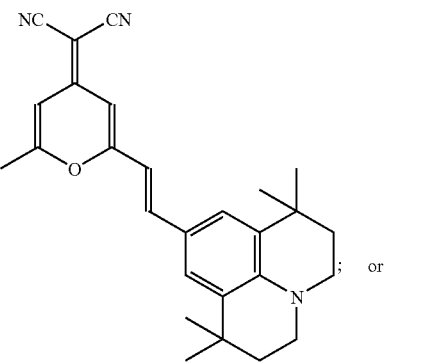

L38 or

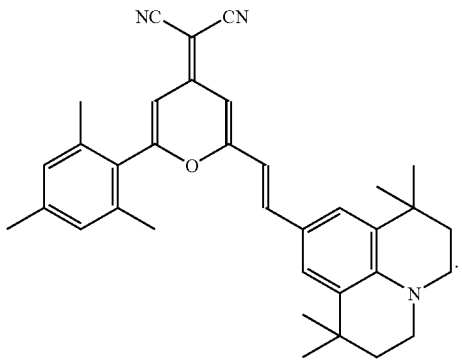

L40

A preferred DCM dopant is DCJTB. A useful red dopant can also be a mixture of compounds that would also be red dopants individually.

In a preferred embodiment, second light-emitting layer (LEL2) 142 is provided over or under first light-emitting layer 141. Second light-emitting layer 142 can have a peak emission in the blue to cyan portion of the spectrum, so that white light is produced by the combined emission of the two light-emitting layers when the first light-emitting layer has a peak emission in the yellow to red portion of the spectrum. Second light-emitting layer 142 includes a second host material and a second light-emitting material. In one embodiment, the second host material is one or more mono-anthracene derivatives, wherein the mono-anthracene derivatives are selected from the same potential mono-anthracene derivatives as for first light-emitting layer 141. The mono-anthracene derivative(s) selected for second light-emitting layer 142 can be the same as or different from those selected for first light-emitting layer 141.

In another embodiment, the second host material can include a mixture of one or more mono-anthracene derivatives provided in a volume fraction range of greater than 85% to less than 100% relative to the total host volume, and one or more aromatic amine derivatives provided in a volume fraction range of greater than 0% to less than 15% relative to the total host volume. The mono-anthracene derivatives are selected from the same mono-anthracene derivative candidates, and the aromatic amine derivatives from the same aromatic amine derivative candidates, as for first light-emitting layer 141. The mono-anthracene derivative(s) selected for second light-emitting layer 142 can be the same as or different from those selected for first light-emitting layer 141. Likewise, the aromatic amine derivative(s) selected for second light-emitting layer 142 can be the same as or different from those selected for first light-emitting layer 141.

Desired OLED materials can be deposited by any suitable method such as evaporation, sputtering, and chemical vapor deposition or radiation thermal transfer. Useful OLED materials are well known. As more fully described in U.S. Pat. Nos. 4,769,292 and 5,935,721, each of the light-emitting layers of the organic EL element includes a luminescent or fluorescent material where electroluminescence is produced as a result of electron-hole pair recombination in this region. It is also possible for recombination in one light-emitting layer to produce luminescence in another light-emitting layer by way of an energy transfer process. While light-emitting layers can be comprised of a single material, they more commonly include a host material doped with a guest compound or dopant where light emission comes primarily from the dopant. The practice of this invention concerns such host/dopant light-emitting layers and OLED devices. The dopant is selected to produce color light having a particular spectrum. The dopant is usually chosen from highly fluorescent dyes, and is typically coated as 0.01 to 10% by weight into the host material.

An important relationship for choosing a dye as a dopant is the value of the optical bandgap, which is defined the energy difference between the emissive excited state and the ground state of the molecule and is approximately equal to the energy difference between the lowest unoccupied molecular orbital and the highest occupied molecular orbital of the molecule. For efficient energy transfer from the host material to the dopant molecule, or to prevent back-transfer of energy from the dopant to the host, a necessary condition is that the band gap of the dopant be smaller than that of the host material.

Host and emitting materials known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; 6,020,078; 6,475,648; 6,534,199; 6,661,023; and U.S. Patent Application Publications 2002/0127427 A1; 2003/0198829 A1, 2003/0203234 A1; 2003/0224202 A1; and 2004/0001969 A1.

The second light-emitting material can be a light-emitting blue dopant and can include perylene or derivatives thereof, blue-emitting derivatives of distyrylbenzene or a distyrylbiphenyl that have one or more aryl amine substituents, or a compound of the structure M1:

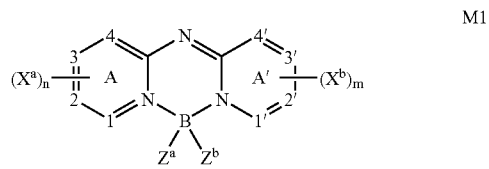

M1 wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants include the following:

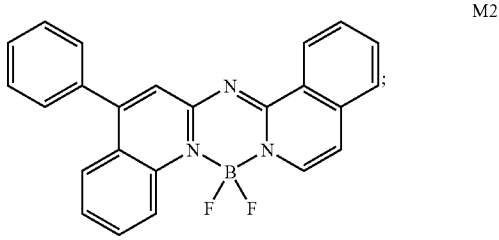

M2

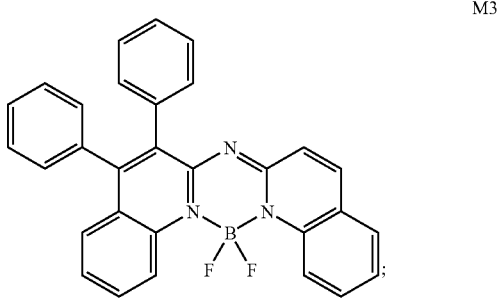

M3

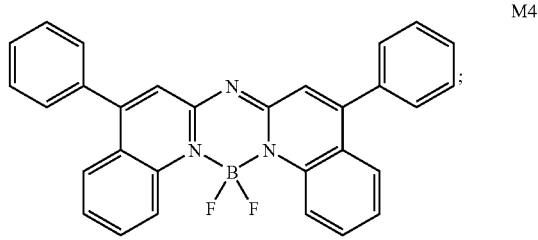

M4

-continued

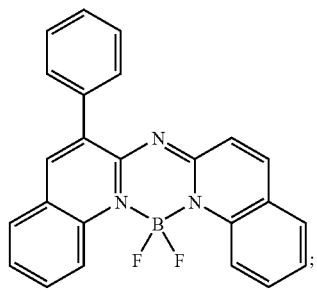
M5

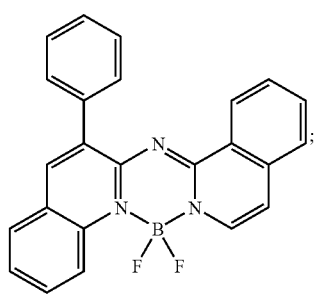
M6

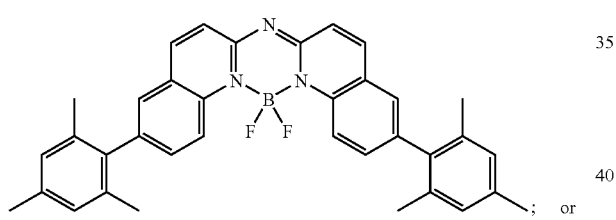
M7

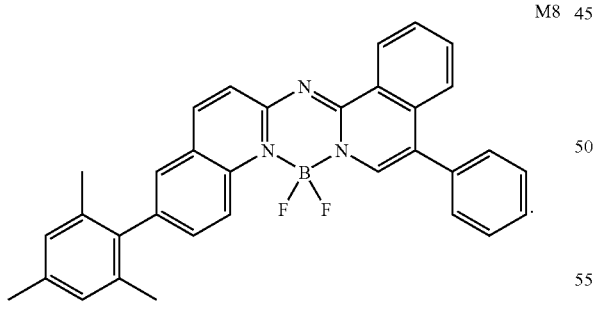
M8

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure N1 shown below:

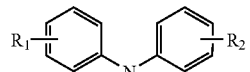
N1 and bis[2-[4-[N,N-diarylamino]phenyl]vinyl]biphenyls of the general structure N2 shown below:

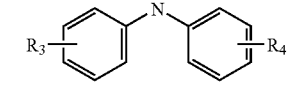
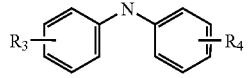
N2

In Formulas N1 and N2, $R_1$-$R_4$ can be the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BDTAPVB, Formula L47 above).

While not always necessary, it is often useful that OLED device 300 includes an organic layer disposed over light-emitting layers 140, wherein the organic layer includes an electron-transporting material, e.g. electron-transporting layer 150. Desired electron-transporting materials can be deposited by any suitable way such as evaporation, sputtering, chemical vapor deposition, electrochemical process, thermal transfer, or laser thermal transfer from a donor material. Preferred electron-transporting materials for use in electron-transporting layer 150 are metal chelated oxinoid compounds, including chelates of oxine itself (also commonly referred to as 8-quinolinol or 8-hydroxyquinoline). Such compounds help to inject and transport electrons and both exhibit high levels of performance and are readily fabricated in the form of thin films. Exemplary of contemplated oxinoid compounds are those satisfying structural Formula E

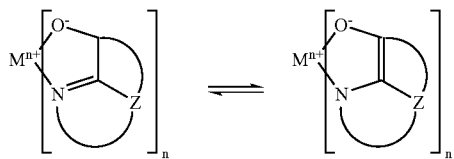

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as beryllium, magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-☐-oxo-bis(2-methyl-8-quinolinolato)aluminum(III);
CO-5: Indium trisoxine [alias, tris(8-quinolinolato)indium];
CO-6: Aluminum tris(5-methyloxine) [alias, tris(5-methyl-8-quinolinolato)aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

In some embodiments of this invention, it is useful to add a mono-anthracene derivative to electron-transporting layer 150, wherein the mono-anthracene derivative is present in an amount up to 50% by volume. The mono-anthracene derivative is selected from the same mono-anthracene derivative candidates as for light-emitting layer 140. The mono-anthracene derivative selected for electron-transporting layer 150 can be the same as or different from those selected for the light-emitting layers.

It will be understood that, as is common in the art, some of the layers can have more than one function. Light-emitting layer 140 can have hole-transporting properties or electron-transporting properties as desired for performance of the OLED device. Hole-transporting layer 130 or electron-transporting layer 150, or both, can also have emitting properties. In such a case, fewer layers than described above can be sufficient for the desired emissive properties, or additional useful emissive properties can be obtained with the use of additional emissive layers. For example, electron-transporting layer 150 can include a light-emitting material, thereby providing a additional light-emitting layer.

The organic EL media materials mentioned above are suitably deposited through a vapor-phase method including evaporation, sublimation, sputtering, chemical vapor deposition, and thermal transfer from a donor element. Organic EL media materials can alternatively be deposited from a fluid, for example, from a solvent with an optional binder to improve film formation. Deposition from a fluid can be done in many ways including, but not limited to ink-jet, spin coating, curtain coating, spray coating, and electrochemical deposition. If the material is a polymer, solvent deposition is usually preferred, but other methods can be used, including sputtering, electrochemical deposition, electrophoretic deposition or thermal transfer from a donor sheet. The material to be deposited by evaporation or sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet.

An electron-injecting layer 160 can also be present between the cathode and the electron-transporting layer. Examples of electron-injecting materials include alkali or alkaline earth metals, alkali halide salts, such as LiF, or alkali or alkaline earth metal doped organic layers.

Cathode 170 is formed over the electron-injecting layer 160 or over electron-transporting layer 150 if an electron-injecting layer is not used. When light emission is through the anode 110, the cathode material can be comprised of nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material is comprised of a Mg:Ag alloy wherein the percentage of silver is in the range of 1% to 20% by atomic ratio, as described in U.S. Pat. No.

4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through cathode 170, it should be transparent or nearly transparent. For such applications, metals should be thin or one should use transparent conductive oxides, or include these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 6,137,223; 6,140,763; 6,278,236; 6,284,393; 6,548,956; and EP 1 076 368. Thermal evaporation, electron beam evaporation, ion sputtering, or chemical vapor deposition can deposit cathode materials. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 170 is spaced, meaning it is vertically spaced apart from anode 110. Cathode 170 can be part of an active matrix device and in that case is a single electrode for the entire display. Alternatively, cathode 170 can be part of a passive matrix device, in which each cathode 170 can activate a column of pixels, and cathodes 170 are arranged orthogonal to anodes 110.

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can use separate sublimation boats or the materials can be premixed and coated from a single boat or donor sheet. Patterned deposition can be achieved using shadow masks, integral shadow masks (U.S. Pat. No. 5,294,870), spatially defined thermal dye transfer from a donor sheet (U.S. Pat. Nos. 5,688,551; 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium or a color conversion filters in functional relationship with the light-emitting areas of the display. Filters, polarizers, and anti-glare or anti-reflection coatings can also be provided over a cover or as part of a cover.

White or broadband emission can be combined with color filters to provide full color or multicolor display. The color filters can include red, green, and blue filters. The present invention is suitably used in displays having four differently colored pixels, for example, red, green, blue, and white emitting pixels (RGBW) as described in U.S. Patent Application Publication 2004/0113875 A1. The white emitting pixel is substantially not filtered, although it can have some small amount of filtering to trim the color or incidental filtering that might occur due to encapsulation layers or the like provided over the white pixel. Five or more color systems can also be useful.

The OLED device can have a microcavity structure. In one useful example, one of the metallic electrodes is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

The present invention can be employed in most OLED device applications. These include very simple structures comprising a single anode and cathode to more complex devices, such as area color displays, passive matrix displays comprised of orthogonal arrays of anodes and cathodes to form pixels, and active matrix displays where each pixel is controlled independently, for example, with thin film transistors (TFTs). The invention can also be employed for devices where the OLED is used as a light source, for example, in solid-state lighting or backlights for LCD displays.

EXAMPLES

The following examples are presented for a further understanding and appreciation of the present invention. The EL characteristics of all the fabricated devices were evaluated using a constant current source (KEITHLEY 2400 SourceMeter) and a photometer (PHOTO RESEARCH SpectraScan PR 650) at room temperature. The colors are reported using Commission Internationale de l'Eclairage (CIE) coordinates. In the following, mixed compositions are described in terms of percentages or ratios by volume, as are commonly used in the art. Although described in detail below, for convenience, the device structures are summarized in Table 1.

All OLED devices had an emission area of 10 mm$^2$, and were initially tested by applying a current of 20 mA/cm$^2$ across the electrodes to determine luminance efficiency (cd/A), driving voltage (V), and color coordinates. The devices were further tested for operational stability at room temperature (25° C. ambient conditions under 80 mA/cm2 driving conditions). The luminance stability is reported in terms of time to half of its initial brightness, and the voltage rise during stability testing is also reported. These data can be found in Table 2.

Comparative Example 1

Blue Control Device

A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately 10$^{-6}$ Torr:

a) A 10 nm hexatriphenylene derivative (Formula Q1)

b) A 140 nm hole-transporting layer of 4,4'-bis[N-(1-naphthyl)-N-phenylamino]biphenyl (NPB);

c) A 20 nm blue light-emitting layer including 92% 9-(1-naphthyl)-10-(biphenyl-4-yl) anthracene (Blue Host-Formula AH3), 7% NPB, and 1% Formula M7 as blue light-emitting dopant;

d) A 40 nm layer of as an electron-transporting layer (ETL) with 49% tris(8-quinolinolato) aluminum (III) (ALQ), 49% B-phen and 2% Li; and e) A 100 nm layer of aluminum, to form a cathode layer.

After deposition of these layers the device was then transferred to a dry box for encapsulation. The devices thus formed were tested electroluminescent properties for drive voltage, luminance efficiency and color at an operating current of 20 mA/cm$^2$. The operational stability of the devices was measured at 80-mA/cm2 constant direct current density at ambient conditions of 20° C. The results are reported in Table 2. This comparative device has luminance efficiency of 3.8 cd/A at drive voltage of 4.4 volts and emitting in the blue region of the electromagnetic spectrum with color coordinates (CEIx, y=0.15, 0.16). This device has operational half-life of 433 hours.

Comparative Example 2

A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately 10$^{-6}$ Torr:

a) A 10 nm hexatriphenylene derivative (Formula Q1)

b) A 120 nm hole-transporting layer of 4,4'-bis[N-('-naphthyl)-N-phenylamino]biphenyl (NPB);

c) A 20 nm another hole transporting layer including 70% NPB (as host) and 30% anthracene derivative as first stabilizing dopant as shown in Formula AH3;

d) A 22 nm blue light-emitting layer including 92% 9-(1-naphthyl)-10-(biphenyl-4-yl) anthracene (Blue Host-Formula AH3), 7% NPB, and 1% Formula M7 as blue light-emitting dopant;

e) A 40 nm layer of as an electron-transporting layer (ETL) with 49% tris(8-quinolinolato) aluminum (III) (ALQ), 49% B-phen and 2% Li; and f) A 100 nm layer of aluminum, to form a cathode layer.

After deposition of these layers the device was then transferred to a dry box for encapsulation. The devices thus formed were tested for electroluminescent properties such as drive voltage, luminance efficiency and color at an operating current of 20 mA/cm$^2$. The operational stability of the devices was measured at 80 mA/cm2 constant direct current density at ambient conditions of 20° C. The results are included in Table 2. This comparative device has luminance efficiency of 3.9 cd/A at drive voltage of 4.5 volts and emitting in the blue region of the electromagnetic spectrum with color coordinates (CEIx,y=0.15, 0.16). This device has operational half-life of 658 hours, which is higher than the device of comparative Example 1.

Example 3

Invention

An inventive OLED device Example 3 of the invention was prepared following process. A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately 10$^{-6}$ Torr:

a) A 10 nm hexatriphenylene derivative (Formula Q1)

b) A 110 nm undoped hole-transporting layer of 4,4'-bis[N-(1-naphthyl)-N-phenylamino]biphenyl (NPB). This forms un-doped sublayer HTL3;

c) A 10 nm another hole transporting layer including 70% NPB (as host) and 30% anthracene derivative as one stabilizing dopant as shown in Formula AH3 and another stabilizing dopant 2% Rubrene derivative (Formula L50). This forms the hole transporting sublayer HTL2);

d) A 20 nm another hole transporting layer including 70% NPB (as host) and 30% anthracene derivative as first stabilizing dopant as shown in Formula AH3. This forms the hole transporting sublayer HTL1);

e) A 22 nm blue light-emitting layer including 92% 9-(1-naphthyl)-10-(biphenyl-4-yl) anthracene (Blue Host-Formula AH3), 7% NPB, and 1% Formula M7 as blue light-emitting dopant;

f) A 40 nm layer of as an electron-transporting layer (ETL) with 49% tris(8-quinolinolato) aluminum (III) (ALQ), 49% B-phen and 2% Li; and g) A 100 nm layer of aluminum, to form a cathode layer.

After deposition of these layers the device was then transferred to a dry box for encapsulation. The devices thus formed were tested for electroluminescent properties such as drive voltage, luminance efficiency and color at an operating current of 20 mA/cm$^2$. The operational stability of the devices was measured at 80 mA/cm2 constant direct current density at ambient conditions of 20° C. The results are included in Table 2.

This Inventive device has luminance efficiency of 4.5 cd/A at drive voltage of 4.8 volts and emitting in the blue region of the electromagnetic spectrum with color coordinates (CEIx, y=0.16, 0.17). This device has operational half-life of 1200 hours, which is significantly higher than the device of comparative Example 1. Thus this inventive device has both improved efficiency and lifetime as compared to the comparative Examples 1 and 2. Thus doping of the HTL1 layer with a third dopant has greatly enhanced the stability as well as device efficiency.

Example 4

Invention

An inventive OLED device Example 4 of the invention was prepared following process. A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately $10^{-6}$ Torr:

a) A 10 nm hexatriphenylene derivative (Formula Q1)
b) A 110 nm undoped hole-transporting layer of 4,4'-bis[N-(1-naphthyl)-N-phenylamino]biphenyl (NPB). This forms un-doped sublayer HTL3;
c) A 20 nm another hole transporting layer including 70% NPB (as host) and 30% anthracene derivative as one stabilizing dopant as shown in Formula AH3 and another stabilizing dopant 2% Rubrene derivative (Formula L50). This forms the hole transporting sublayer HTL2);
d) A 10 nm another hole transporting layer including 70% NPB (as host) and 30% anthracene derivative as first stabilizing dopant as shown in Formula AH3. This forms the hole transporting sublayer HTL1)
e) A 22 nm blue light-emitting layer including 92% 9-(1-naphthyl)-10-(biphenyl-4-yl) anthracene (Blue Host-Formula AH3), 7% NPB, and 1% Formula M7 as blue light-emitting dopant;
f) A 40 nm layer of as an electron-transporting layer (ETL) with 49% tris(8-quinolinolato) aluminum (III) (ALQ), 49% B-phen and 2% Li; and
A 100 nm layer of aluminum, to form a cathode layer.

After deposition of these layers the device was then transferred to a dry box for encapsulation. The devices thus formed were tested for electroluminescent properties such as drive voltage, luminance efficiency and color at an operating current of 20 mA/cm². The operational stability of the devices was measured at 80 mA/cm2 constant direct current density at ambient conditions of 20° C. The results are included in Table 2.

This Inventive device has luminance efficiency of 4.6 cd/A at drive voltage of 4.6 volts and emitting in the blue region of the electromagnetic spectrum with color coordinates (CEIx, y=0.18, 0.19). This device has operational half-life of 1200 hours, which is significantly higher than the device of comparative Example 1. Thus this inventive device has both improved efficiency and lifetime as compared to the comparative Examples 1 and 2. Thus doping of the HTL1 layer with a third dopant has greatly enhanced the stability as well as device efficiency.

Example 5

Invention

An OLED device Example 5 of the invention was prepared following process. A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately $10^{-6}$ Torr:

a) A 10 nm hexatriphenylene derivative (Formula Q1)
b) A 110 nm undoped hole-transporting layer of 4,4'-bis[N-(1-naphthyl)-N-phenylamino]biphenyl (NPB). This forms un-doped sublayer HTL3;
c) A 20 nm second hole transporting layer including 70% NPB (as host) and 30% anthracene derivative as one stabilizing dopant as shown in Formula AH3 and another stabilizing dopant 1% veriflanthene derivative (Formula Q10). This forms the hole transporting sublayer HTL2);
d) A 20 nm another hole transporting layer including 70% NPB (as host) and 30% anthracene derivative as first stabilizing dopant as shown in Formula AH3. This forms the hole transporting sublayer HTL1) D)A 22 nm blue light-emitting layer including 92% 9-(1-naphthyl)-10-(biphenyl-4-yl) anthracene (Blue Host-Formula AH3), 7% NPB, and 1% Formula M7 as blue light-emitting dopant;
e) A 40 nm layer of as an electron-transporting layer (ETL) with 49% tris(8-quinolinolato) aluminum (III) (ALQ), 49% B-phen and 2% Li; and
f) A 100 nm layer of aluminum, to form a cathode layer.

After deposition of these layers the device was then transferred to a dry box for encapsulation. The devices thus formed were tested for electroluminescent properties such as drive voltage, luminance efficiency and color at an operating current of 20 mA/cm². The operational stability of the devices was measured at 80 mA/cm2 constant direct current density at ambient conditions of 20° C. The results are included in Table 2.

This Inventive device has luminance efficiency of 4.4 cd/A at drive voltage of 4.8 volts and emitting in the blue region of the electromagnetic spectrum with color coordinates (CEIx, y=0.17, 0.17). This device has operational half-life of 1000 hours, which is significantly higher than the device of comparative Example 1. Thus this inventive device has both improved efficiency and lifetime as compared to the comparative Examples 1 and 2. Thus doping of the HTL1 layer with a third dopant such as the material given by the Formula Q4 has greatly enhanced the stability as well as device efficiency Example 6

Blue Comparative Device

A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately $10^{-6}$ Torr:

a) A 10 nm hexatriphenylene derivative (Formula Q1)
b) A 140 nm hole-transporting layer of 4,4'-bis[N-(1-naphthyl)-N-phenylamino]biphenyl (NPB);
c) A 20 nm blue light-emitting layer including 92% 9-(1-naphthyl)-10-(biphenyl-4-yl) anthracene (Blue Host-Formula AH3), 7% NPB, and 1% blue light-emitting dopant TBP formula shown as L2;

d) A 40 nm layer of as an electron-transporting layer (ETL) with 49% tris(8-quinolinolato) aluminum (III) (ALQ), 49% B-phen and 2% Li; and e) A 100 nm layer of aluminum, to form a cathode layer.

After deposition of these layers the device was then transferred to a dry box for encapsulation. This control device thus formed was tested electroluminescent properties for drive voltage, luminance efficiency and color at an operating current of 20 mA/cm$^2$. The operational stability of the devices was measured at 80 mA/cm2 constant direct current density at ambient conditions of 20° C. The results are reported in Table 2. This comparative device has luminance efficiency of 4.2 cd/A at drive voltage of 4.7 volts and emitting in the blue region of the electromagnetic spectrum with color coordinates (CEIx,y=0.14, 0.19). This device has operational half-life of 433 hours.

Example 7

Invention

An OLED device Example 7 of the invention was prepared following process. A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately 10$^{-6}$ Torr:

a) A 10 nm hexatriphenylene derivative (Formula Q1)

b) A 100 nm undoped hole-transporting layer of 4,4'-bis[N-(1-naphthyl)-N-phenylamino]biphenyl (NPB). This forms un-doped sublayer HTL3;

c) A 20 nm another hole transporting layer including 70% NPB (as host) and 30% anthracene derivative as one stabilizing dopant as shown in Formula AH3 and another stabilizing dopant 2% Rubrene derivative (Formula L50). This forms the hole transporting sublayer HTL2);

d) A 20 nm another hole transporting layer including 70% NPB (as host) and 30% anthracene derivative as first stabilizing dopant as shown in Formula AH3. This forms the hole transporting sublayer HTL1)

e) A 22 nm blue light-emitting layer including 92% 9-(1-naphthyl)-10-(biphenyl-4-yl) anthracene (Blue Host-Formula AH3), 7% NPB, and 1% TBP Formula L2 as blue light-emitting dopant;

f) A 40 nm layer of as an electron-transporting layer (ETL) with 49% tris(8-quinolinolato) aluminum (III) (ALQ), 49% B-phen and 2% Li; and g) A 100 nm layer of aluminum, to form a cathode layer.

After deposition of these layers the device was then transferred to a dry box for encapsulation. The devices thus formed were tested for electroluminescent properties such as drive voltage, luminance efficiency and color at an operating current of 20 mA/cm$^2$. The operational stability of the devices was measured at 80 mA/cm2 constant direct current density at ambient conditions of 20° C. The results are included in Table 2.

This Inventive device has luminance efficiency of 6 cd/A at drive voltage of 4.5 volts and emitting in the blue region of the electromagnetic spectrum with color coordinates (CEIx, y=0.20, 0.25). This device has operational half-life of 1500 hours, which is significantly higher than the device of comparative Example 1. Thus this inventive device has both improved efficiency and lifetime as compared to the comparative Example 6. Thus doping of the HTL1 layer with a third dopant has greatly enhanced the stability as well as device efficiency.

Example 8

Comparative Blue Device

A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately 10$^{-6}$ Torr:

a) A 10 nm hexatriphenylene derivative (Formula Q1)

b) A 20 nm hole-transporting layer of 4,4'-bis[N-(1-naphthyl)-N-phenylamino]biphenyl (NPB);

c) A 30 nm blue light-emitting layer including 92% 9-(1-naphthyl)-10-(biphenyl-4-yl) anthracene (Blue Host-Formula AH3), 7% NPB, and 1% blue light-emitting dopant TBP formula shown as L2;

d) A 40 nm layer of as an electron-transporting layer (ETL) with 49% tris(8-quinolinolato) aluminum (III) (ALQ), 49% B-phen and 2% Li; and e) A 100 nm layer of aluminum, to form a cathode layer.

After deposition of these layers the device was then transferred to a dry box for encapsulation. This control device thus formed was tested electroluminescent properties for drive voltage, luminance efficiency and color at an operating current of 20 mA/cm$^2$. The operational stability of the devices was measured at 80 mA/cm2 constant direct current density at ambient conditions of 20° C. The results are reported in Table 2. This comparative device has luminance efficiency of 5.6 cd/A at drive voltage of 4.0 volts and emitting in the blue region of the electromagnetic spectrum with color coordinates (CEIx,y=0.14, 0.23). This device has operational half-life of 226 hours.

Example 9

Invention

An OLED device Example 9 of the invention was prepared following process. A clean glass substrate was vacuum-deposited with indium tin oxide (ITO) to form a transparent electrode 85 nm thick. The above-prepared ITO surface was treated with a plasma oxygen etch. The following layers were then deposited in the following sequence by evaporation from heated boats under a vacuum of approximately 10$^{-6}$ Torr:

a) A 10 nm hexatriphenylene derivative (Formula Q1)

b) A 100 nm undoped hole-transporting layer of 4,4'-bis[N-(1-naphthyl)-N-phenylamino]biphenyl (NPB). This forms un-doped sublayer HTL3;

c) A 10 nm another hole transporting layer including 70% NPB (as host) and 30% another anthracene derivative as one stabilizing dopant as shown Formula AH10 and another stabilizing dopant 2% Rubrene derivative (Formula L50). This forms the hole transporting sublayer HTL2;

d) A 10 nm another hole transporting layer including 70% NPB (as host) and 30% anthracene derivative as first stabilizing dopant as shown in Formula AH10. This forms the hole transporting sublayer HTL1 e) A 30 nm blue light-emitting layer including 92% 9-(1-naphthyl)-10-(biphenyl-4-yl) anthracene (Blue Host-Formula AH3), 7% NPB, and 1% TBP Formula L2 as blue light-emitting dopant;

f) A 40 nm layer of as an electron-transporting layer (ETL) with 49% tris(8-quinolinolato) aluminum (III) (ALQ), 49% B-phen and 2% Li; and g) A 100 nm layer of aluminum, to form a cathode layer.

After deposition of these layers the device was then transferred to a dry box for encapsulation. The devices thus formed were tested for electroluminescent properties such as drive voltage, luminance efficiency and color at an operating current of 20 mA/cm². The operational stability of the devices was measured at 80 mA/cm2 constant direct current density at ambient conditions of 20° C. The results are included in Table 2.

This Inventive device has luminance efficiency of 6.3 cd/A at drive voltage of 4.2 volts and emitting in the blue region of the electromagnetic spectrum with color coordinates (CEIx, y=0.18, 0.28). This device has operational half-life of 530 hours, which is significantly higher than the device of comparative Example 8. Thus this inventive device has both improved efficiency and lifetime as compared to the comparative Example 6. Thus, doping of the HTL2 layer with a first dopant has greatly enhanced the stability as well as device efficiency.

TABLE 1

Device Structures

| | HIL | HTL 3 (Third hole transporting layer) | HTL 2 (Second hole transporting layer) | HTL 1 (First hole transporting layer) |
|---|---|---|---|---|
| Example 1 (Blue Control) | 10 nm hexatriphenylene derivative Formula Q1 | 140 nm NPB | | |
| Example 2 (Blue Control) | 10 nm hexatriphenylene derivative Formula Q1 | 120 nm NPB | | 20 nm (NPB First hole transporting material (NPB) + 30% First stabilizing dopant (blue host Formula AH3) |
| Example 3 (Invention) | 10 nm hexatriphenylene derivative Formula Q1 | 110 nm NPB | 10 nm (Hole transporting material (NPB) + 30% stabilizing dopant (blue host Formula AH3) + 2.0% third stabilizing dopant (Formula L50) | 20 nm (NPB First hole transporting material (NPB) + 30% First stabilizing dopant (blue host Formula AH3) |
| Example 4 (Invention) | 10 nm hexatriphenylene derivative Formula Q1 | 110 nm NPB | 20 nm (Hole transporting material (NPB) + 30% stabilizing dopant (blue host Formula AH3) + 2.0% third stabilizing dopant (Formula L50) | 10 nm (NPB First hole transporting material (NPB) + 30% First stabilizing dopant (blue host Formula AH3) |
| Example 5 (Invention) | 10 nm hexatriphenylene derivative Formula Q1 | 110 nm NPB | 20 nm (Hole transporting material (NPB) + 30% stabilizing dopant (blue host Formula AH3) + 1.0% third stabilizing dopant (Formula Q10) | 20 nm (NPB First hole transporting material (NPB) + 30% First stabilizing dopant (blue host Formula AH3) |
| Example 6 (Blue Control) | 10 nm hexatriphenylene derivative Formula Q1 | 140 nm NPB | | |
| Example 7 (Invention) | 10 nm hexatriphenylene derivative Formula Q1 | 100 nm NPB | 20 nm (Hole transporting material (NPB) + 30% stabilizing dopant (blue host Formula AH3) + 2.0% third stabilizing dopant (Formula L50) | 20 nm (NPB First hole transporting material (NPB) + 50% First stabilizing dopant (blue host Formula AH3) |
| Example 8 (Blue Control) | 10 nm hexatriphenylene derivative Formula Q1 | | 20 nm NPB | |
| Example 9 (Invention) | 10 nm hexatriphenylene derivative Formula Q1 | | 10 nm (Hole transporting material (NPB) + 30% stabilizing dopant (blue host Formula AH10) + 2.0% third stabilizing dopant (Formula L50) | 10 nm (NPB First hole transporting material (NPB) + 30% First stabilizing dopant (blue host Formula AH10) |

| | | Blue Light Emitting Layer | ETL |
|---|---|---|---|
| Example 1 (Blue Control) | | 22 nm (blue host Formula AH3 + 7% NPB + 1% blue dopant formula M7) | 40 nm (49% Alq + 49% B-phen + 2% Li) |
| Example 2 (Blue Control) | | 22 nm (blue host Formula AH3 + 7% NPB + 1% blue dopant formula M7) | 40 nm (49% Alq + 49% B-phen + 2% Li) |
| Example 3 (Invention) | | 22 nm (blue host Formula AH3 + 7% NPB + 1% blue dopant formula M7) | 40 nm (49% Alq + 49% B-phen + 2% Li) |
| Example 4 (Invention) | | 22 nm (blue host Formula AH3 + 7% NPB + 1% blue dopant formula M7) | 40 nm (49% Alq + 49% B-phen + 2% Li) |
| Example 5 (Invention) | | 22 nm (blue host Formula AH3 + 7% NPB + 1% blue dopant formula M7) | 40 nm (49% Alq + 49% B-phen + 2% Li) |
| Example 6 (Blue Control) | | 20 nm (blue host Formula AH3 + 7% NPB + 1% TBP formula L2) | 40 nm (49% Alq + 49% B-phen + 2% Li) |
| Example 7 (Invention) | | 20 nm (blue host Formula AH3 + 7% NPB + 1% TBP formula L2) | 40 nm (49% Alq + 49% B-phen + 2% Li) |

TABLE 1-continued

| | | | |
|---|---|---|---|
| Example 8 (Blue Control) | 30 nm (blue host Formula AH3 + 7% NPB + 1% TBP formula L2) | | 40 nm (49% Alq + 49% B-phen + 2% Li) |
| Example 9 (Invention) | 30 nm (blue host Formula AH3 + 7% NPB + 1% TBP formula L2) | | 40 nm (49% Alq + 49% B-phen + 2% Li) |

TABLE 2

Device Performance data

| | Drive Voltage (V) | Luminance efficiency (cd/A) | Chromaticity, CIEx | Chromaticity, CIEy | Stability (Half-life @ 80 mA/cm2) |
|---|---|---|---|---|---|
| Example 1 (Blue Control) | 4.4 | 3.8 | 0.15 | 0.14 | 433 Hrs |
| Example 2 (Blue Control) | 4.5 | 3.9 | 0.15 | 0.16 | 658 Hrs |
| Example 3 (Invention) | 4.8 | 4.5 | 0.17 | 0.18 | 1200 Hrs |
| Example 4 (Invention) | 4.6 | 4.6 | 0.18 | 0.19 | 1200 Hrs |
| Example 5 (Invention) | 4.8 | 4.4 | 0.17 | 0.17 | 1000 Hrs |
| Example 6 (Blue Control) | 4.7 | 4.2 | 0.14 | 0.19 | 400 Hrs |
| Example 7 (Invention) | 4.5 | 6.0 | 0.20 | 0.25 | 1500 Hrs |
| Example 8 (Blue Control) | 4.0 | 5.6 | 0.14 | 0.23 | 226 Hrs |
| Example 9 (Invention) | 4.2 | 6.3 | 0.18 | 0.28 | 530 Hrs |

It can be readily seen that this invention provides a way to make an OLED device that has improved stability and improved efficiency. The invention has been described in detail with particular reference to certain preferred embodiments thereof, but it will be understood that variations and modifications can be effected within the spirit and scope of the invention.

PARTS LIST

100 OLED Structure
101 Substrate
110 Anode
120 HIL
130 HTL
131 HTL1
132 HTL2
133 HTL3
140 LEL
150 ETL
160 EIL
170 Cathode
200 OLED structure
300 OLED structure

The invention claimed is:

1. An organic electroluminescent device, comprising:
a) a substrate;
b) an anode and a cathode;
c) a light-emitting layer disposed between the anode and cathode including a host and a light-emitting dopant according to formula M1;

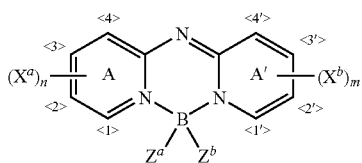

M1 wherein:
A and A' represent independent azine ring systems corresponding to 6-membered aromatic ring systems containing at least one nitrogen;

$(X^a)_n$ and $(X^b)_m$ represent one or more independently selected substituents and include acyclic substituents or we joined to form a ring fused to A or A';
m and n are independently (I) to 4;
$Z^a$ and $Z^b$ are independently selected substituents;
1,2,3,4,1',2',3',4' are independently selected as either carbon or nitrogen atoms; and provided that $X^a$, $X^b$, $Z^a$ and $Z^b$, 1,2,3,4,1',2',3',4' are selected to provide blue luminescence; and d) a hole-transporting structure disposed between the light-emitting layer and the anode including three sublayers, a first sublayer in contact with the light-emitting layer and including a first hole-transporting material and a first stabilizing dopant which is an anthracene, and a second sublayer in contact with the first sublayer including a second hole-transporting material and a second stabilizing dopant which is an anthracene, and a third dopant having a bandgap that is smaller than each of the bandgaps of the second hole-transporting material and the second stabilizing dopant, respectively and the third sublayer including a hole-transporting material disposed between the second sublayer and the anode.

2. The organic electroluminescent device of claim 1 wherein the third dopant is a Rubrene derivative.

3. The organic electroluminescent device of claim 1 wherein the third dopant is a red emitting dopant including a diindenoperylene compound of the following structure Q1:

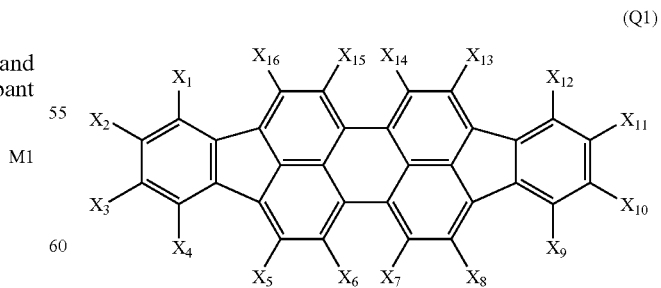

(Q1)

wherein $X_1$-$X_{16}$ are independently selected as hydrogen or substituents selected to provide red luminescence.

4. The organic electroluminescent device of claim 3 wherein the third dopant includes diindenoperylene compound selected from the following structures:

Q2
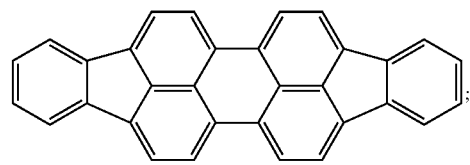
periflanthene,
Q3
Q4
Q5
Q6
Q7
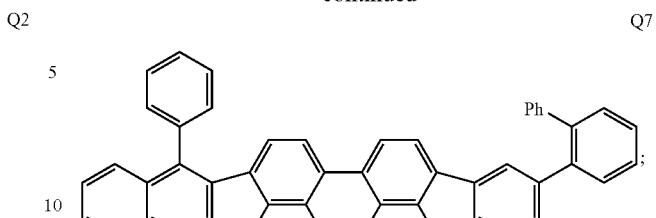
Q8
Q9
Q10
TPDBP,
5. The organic electroluminescent device of claim 1 wherein the thickness of the first sublayer is in a range of from 5 nm to 50 nm.
6. The organic electroluminescent device of claim 1 wherein the first and second hole-transporting materials are the same and wherein the first and second stabilizing dopants are the same.

7. The organic electroluminescent device of claim 1 further including a hole injecting layer including a fluorocarbon compound, hexaazatriphenylene derivatives, porphyrinic compounds, m-MTDATA (4,4',4''-tris[(3-methylphenyl)phenyl-amino]triphenylamine), or inorganic oxides including vanadium oxide (VOx), molybdenum oxide (MoOx), nickel oxide (NiOx) or tungsten oxide (WOx).

* * * * *